(12) United States Patent
Nishimura et al.

(10) Patent No.: US 8,307,782 B2
(45) Date of Patent: *Nov. 13, 2012

(54) DEPOSITION APPARATUS AND DEPOSITION METHOD

(75) Inventors: Kazuhito Nishimura, Nankoku (JP); Hideki Sasaoka, Kochi (JP)

(73) Assignees: Kochi Industrial Promotion Center, Kochi-shi (JP); Casio Computer Co., Ltd., Tokyo (JP)

( * ) Notice: Subject to any disclaimer, the term of this patent is extended or adjusted under 35 U.S.C. 154(b) by 900 days.

This patent is subject to a terminal disclaimer.

(21) Appl. No.: 12/343,263

(22) Filed: Dec. 23, 2008

(65) Prior Publication Data

US 2009/0169769 A1 Jul. 2, 2009

(30) Foreign Application Priority Data

Dec. 26, 2007 (JP) ................................ 2007-335048

(51) Int. Cl.
C23C 16/455 (2006.01)
H01L 21/02 (2006.01)

(52) U.S. Cl. .................................. 118/723 E; 118/724
(58) Field of Classification Search ............... 118/723 E, 118/724
See application file for complete search history.

(56) References Cited

U.S. PATENT DOCUMENTS

| | | | |
|---|---|---|---|
| 5,518,766 A | 5/1996 | Bigelow et al. | |
| 5,772,771 A | 6/1998 | Li et al. | |
| 5,804,089 A * | 9/1998 | Suzuki et al. | 216/71 |
| 6,072,163 A | 6/2000 | Armstrong et al. | |
| 6,203,657 B1 | 3/2001 | Collison et al. | |
| 6,631,692 B1 | 10/2003 | Matsuki et al. | |
| 7,418,921 B2 | 9/2008 | Tsuji et al. | |
| 2001/0019472 A1 | 9/2001 | Kanno et al. | |
| 2002/0002948 A1 | 1/2002 | Hongo et al. | |
| 2004/0212312 A1 | 10/2004 | Chistyakov | |
| 2005/0014031 A1 | 1/2005 | Hiramatsu et al. | |
| 2006/0075969 A1 | 4/2006 | Fischer | |
| 2007/0074664 A1 * | 4/2007 | Nishimura et al. | 118/723 E |
| 2007/0095286 A1 | 5/2007 | Baek et al. | |
| 2007/0251453 A1 | 11/2007 | Hongo et al. | |
| 2008/0134960 A1 | 6/2008 | Kasu et al. | |
| 2008/0226838 A1 * | 9/2008 | Nishimura et al. | 427/569 |

FOREIGN PATENT DOCUMENTS

| | | |
|---|---|---|
| CN | 2666928 Y | 12/2004 |
| CN | 101016624 A | 8/2007 |
| JP | 58-105478 U | 7/1983 |

(Continued)

OTHER PUBLICATIONS

Korean Office Action dated Nov. 9, 2010 (and English translation thereof) in counterpart Korean Application No. 10-2008-0134724.

(Continued)

Primary Examiner — Sylvia R. MacArthur
(74) Attorney, Agent, or Firm — Holtz, Holtz, Goodman & Chick, PC

(57) ABSTRACT

A deposition apparatus includes: a first electrode for placing a processing object; a second electrode for generating plasma with the first electrode, the second electrode being opposed to the first electrode; and a cooling part for cooling the processing object, wherein between the processing object and the cooling part, as compared with a thermal resistance between a central part of the processing object and the cooling part, a thermal resistance between a peripheral part peripheral to the central part and the cooling part is small.

12 Claims, 17 Drawing Sheets

FOREIGN PATENT DOCUMENTS

| | | |
|---|---|---|
| JP | 01-094615 A | 4/1989 |
| JP | 03-087373 A | 4/1991 |
| JP | 4-60552 U | 5/1992 |
| JP | 08-162445 A | 6/1996 |
| JP | 08-227880 A | 9/1996 |
| JP | 8-337497 A | 12/1996 |
| JP | 08-337497 A | 12/1996 |
| JP | 09-025586 A | 1/1997 |
| JP | 2628404 A | 7/1997 |
| JP | 11-307513 A | 11/1999 |
| JP | 2002-220672 A | 8/2002 |
| JP | 2003-113470 A | 4/2003 |
| JP | 2003-347218 A | 12/2003 |
| JP | 2004-193307 A | 7/2004 |
| JP | 2004-277800 A | 10/2004 |
| JP | 2005-089865 A | 4/2005 |
| JP | 2005-267931 A | 9/2005 |
| JP | 2007-053359 A | 3/2007 |
| KR | 1991-0006784 A | 9/1991 |
| KR | 10-2001-0025958 A | 4/2001 |
| KR | 10-2003-0030271 A | 4/2003 |
| KR | 10-2005-0054114 A | 6/2005 |
| KR | 2006-89419 A | 8/2006 |
| TW | 270270 A | 2/1996 |
| TW | 526278 B | 4/2003 |
| TW | I225898 B | 1/2005 |
| WO | WO 2006/065014 A1 | 6/2006 |

OTHER PUBLICATIONS

Chinese Office Action (and English translation thereof) dated Jun. 25, 2010, issued in counterpart Chinese Application No. 200810188628.3.

Chinese Office Action dated May 8, 2009 and English translation thereof issued in a counterpart Chinese Application No. 2006101463665 of *related* U.S. Appl. No. 11/541,306.

Abe, Yoshiyuki, et al. "Diamond Synthesis by High-Gravity D.C. Plasma CVD (HGCVD) With Active Control of the Substrate Temperature," *Acta Astronautica* vol. 48, No. 2-3, pp. 121-127; Great Britain, 2001.

* cited by examiner

DEPOSITION APPARATUS AND DEPOSITION METHOD

BACKGROUND OF THE INVENTION

1. Field of the Invention

The present invention relates to deposition apparatus and deposition method.

2. Descriptions of the Related Art

Diamond deposition with use of a plasma CVD (Chemical Vapor Deposition) method has conventionally been performed. In such diamond deposition, a gas mixture of hydrogen and methane is used as a source gas to deposit a polycrystalline diamond film having a crystalline size of the order of micrometers (hereinafter referred to as an MD film).

In recent years, in the diamond deposition using the gas mixture of hydrogen and methane, a tendency for the crystalline size to rapidly decrease by setting a ratio of methane to 5% or more has been used to form a diamond film having a crystalline size of the order of nanometers (hereinafter referred to as an ND film). Such ND film having a crystalline size of the order of nanometers is smoother than the MD film, and therefore expected to be optically applied.

Also, in plasma CVD apparatus in semiconductor manufacturing, to improve uniformity of deposition, an electrode shape is changed to thereby control an active species density distribution, and gas and electron temperatures in plasma, as disclosed in, for example, Unexamined Japanese Patent Application KOKAI Publication No. 2007-53359.

However, in the plasma CVD, if the electrode is formed in a complicated shape to achieve the uniformity of the deposition, electric field concentration is likely to occur in the vicinity of the electrode where electric field intensity is increased, and therefore some problems arise, for example, stable glow discharge required for the deposition is disturbed, and corona discharge or arc discharge is likely to occur.

Meanwhile, the present inventors and others have been advancing the development of a device material having excellent electron emission characteristics by depositing the nanodiamond film on an aggregate of a graphene sheet structure.

If, upon deposition of such ND film, the methane ratio in an atmosphere inside deposition apparatus is increased, a positive column (a region where a number of active species are incorporated, and a substrate is typically placed so as to be exposed to the positive column) tends to shrink. For this reason, even in the case of the deposition with the same power, a local deposition rate is increased, but the uniformity of the deposition tends to be disturbed.

It is known that, upon deposition of the MD film, $CH_3$ radicals known as a direct material for MD growth can diffuse in plasma because lifetimes of them in the plasma are relatively long, and are therefore uniformly distributed as compared with a density distribution, electron temperature distribution, and gas temperature distribution of the other active species.

However, high chemical potential active species (C, $C_2$, CH, or $C_xH_y$), which is to serve as potential material radicals for ND film growth, is rapidly decreased in density in a region where electron and gas temperatures are low. This is considered as the reason why, in the ND film, an area where with respect to plasma expansion the deposition can be uniformly performed such that electron emission characteristics are uniform tends to narrow as compared with the MD film.

Also, in an electron emission device using the ND film, electrical characteristics of a deposition surface are very sensitive to variations in substrate temperature and active species density in a deposition process, and therefore the electron emission device using the ND film is likely to be influenced by variation in active species density distribution as described above. For this reason, in the deposition for the ND electron emission device, there exists a problem that a deposition area where the device can uniformly emit electrons with respect to an applied field is smaller than an electrode area, resulting in poor in-plane uniformity, and it is difficult to obtain the electron emission film capable of emitting electrons from the entire surface deposited on a substrate.

The present invention has been made in consideration of the above-described actual situations, and has an advantage of providing deposition apparatus and deposition method that are capable of forming a film having good uniformity in in-plane electrical characteristics.

SUMMARY OF THE INVENTION

A deposition apparatus according to a first aspect of the present invention comprises:

a first electrode for placing a processing object;

a second electrode for generating plasma with the first electrode, the second electrode being opposed to the first electrode; and a cooling part for cooling the processing object, wherein between the processing object and the cooling part, as compared with a thermal resistance between a central part of the processing object and the cooling part, a thermal resistance between a peripheral part peripheral to the central part and the cooling part is small.

The first electrode may have a concave on a surface thereof coming into contact with the processing object, and regarding a contact area per unit area between the processing object and the first electrode, a contact area in a region corresponding to the peripheral part of the processing object may be larger than a contact area in a region corresponding to the central part of the processing object, depending on the concave.

The first electrode may have a concave in a region corresponding to the central part of the processing object, and may not have a concave in a region corresponding to the peripheral part of the processing object, on a surface thereof coming into contact with the processing object.

The deposition apparatus may comprise a placing stage for placing the first electrode.

The placing stage may have a concave on a surface thereof coming into contact with the first electrode, and regarding a contact area per unit area between the placing stage and the first electrode, a contact area in a region corresponding to the peripheral part of the processing object may be larger than a contact area in a region corresponding to the central part of the processing object, depending on the concave.

The placing stage may have a concave in a region corresponding to the central part of the processing object, and may not have a concave in a region corresponding to the peripheral part of the processing object, on a surface thereof coming into contact with the first electrode.

The first electrode may have a concave on a surface thereof coming into contact with the placing stage, and regarding a contact area per unit area between the placing stage and the first electrode, a contact area in a region corresponding to the peripheral part of the processing object may be larger than a contact area in a region corresponding to the central part of the processing object, depending on the concave.

The first electrode may have a concave in a region corresponding to the central part of the processing object, and may not have a concave in a region corresponding to the peripheral part of the processing object, on a surface thereof coming into contact with the placing stage.

A deposition apparatus according to a second aspect of the present invention comprises:

a first electrode for placing a processing object;

a second electrode for generating plasma with the first electrode, the second electrode being opposed to the first electrode; and a cooling part for drawing heat from the processing object to generate a heat flow from a central area to a peripheral area of the processing object, wherein the cooling part has a surface coming into contact with a member intervening between the cooling part and the processing object, and a contact area per unit area with the member corresponding to a peripheral part peripheral to a central part of the processing object is larger than a contact area per unit area with the member corresponding to the central part.

The cooling part may comprise a cooling head part;

the member may be the first electrode or a placing stage for placing the first electrode; and a surface of the cooling head part may be concavely formed, the surface being opposed to the first electrode or the placing stage.

The cooling part may comprise a cooling head part;

the member may be the first electrode or a placing stage for placing the first electrode;

a surface of the cooling head part may be formed with a plurality of concaves, the surface being opposed to the first electrode or the placing stage;

the concaves may be more formed in a central area of the cooling head part as compared with a peripheral area; and a contact area at which the cooling head part comes into contact with the first electrode or the placing stage in the peripheral area may be larger than a contact area at which the cooling head part comes into contact with the first electrode or the placing stage in the central area.

The cooling part may comprise a cooling head part;

the member may be the first electrode or a placing stage for placing the first electrode;

a surface of the cooling head part may be more roughed in a central area as compared with a peripheral area, the surface being opposed to the first electrode or the placing stage; and a contact area at which the cooling head part comes into contact with the first electrode or the placing stage in the peripheral area may be larger than a contact area at which the cooling head part comes into contact with the first electrode or the placing stage in the central area.

The cooling part may comprise a cooling head part;

the member may be the first electrode or a placing stage for placing the first electrode;

a surface of the cooling head part may be formed of a first material and a second material in a central area and a peripheral area, respectively, the surface being opposed to the first electrode or the placing stage; and a thermal conductivity of the second material may be larger than a thermal conductivity of the first material.

The cooling part may be formed with a pipeline through which a cooling medium passes.

A deposition method according to a third aspect of the present invention comprises:

placing a processing object on a first electrode; and generating plasma between the first electrode and a second electrode to perform deposition on a surface of the processing object with, between the processing object and a cooling part for cooling the processing object, a thermal resistance between a peripheral part peripheral to a central part of the processing object and the cooling part being smaller than a thermal resistance between the central part and the cooling part.

There can be provided the deposition apparatus and deposition method that are capable of forming a film having good and uniform electrical characteristics within a surface of a substrate by providing within the substrate a temperature gradient appropriate for deposition with use of a cooling part.

BRIEF DESCRIPTION OF THE DRAWINGS

The present invention will be more sufficiently understood by referring to the following detailed description and accompanying drawings; however, these description and drawings are only for a descriptive purpose, and do not limit the scope of the present invention.

DETAILED DESCRIPTIONS OF THE PREFERRED EMBODIMENTS

Deposition apparatus and deposition method according to embodiments of the present invention are described with use of the drawings.

Figure 1:
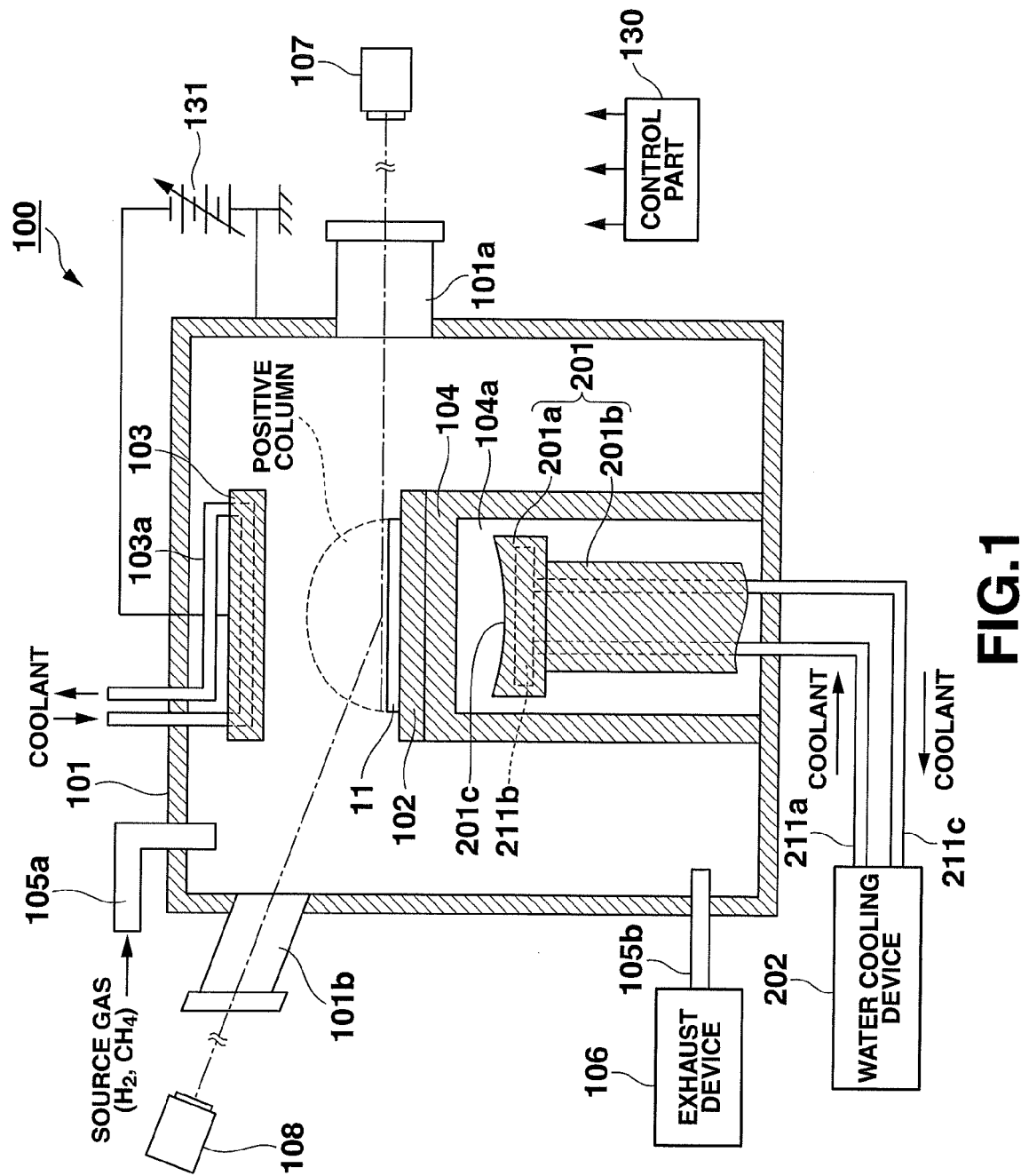
FIG. 1 is a diagram schematically illustrating a configuration example of deposition apparatus according to an embodiment of the present invention.
Figure 2A:
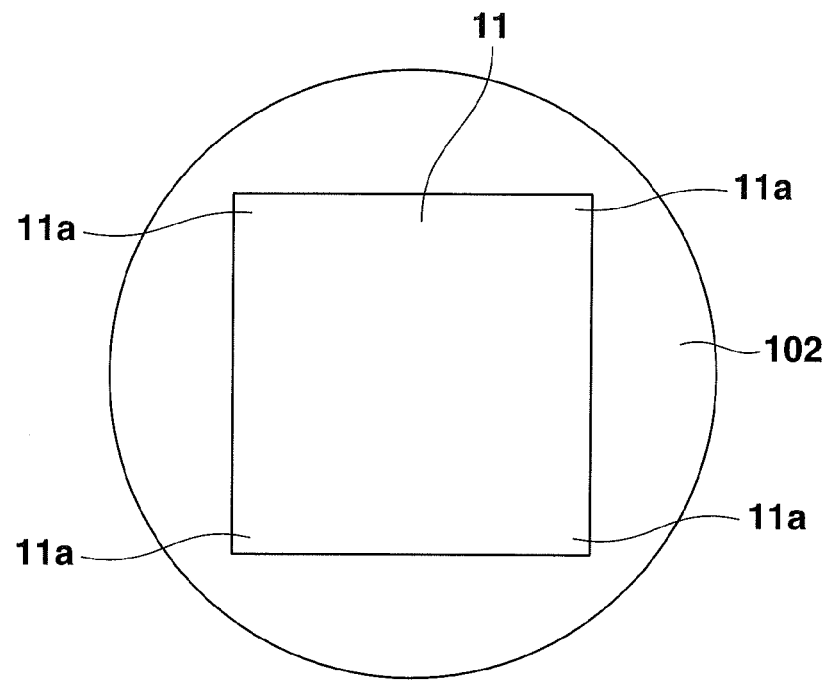
FIG. 2A is a plan view illustrating a configuration example of a cooling part.
Figure 2B:
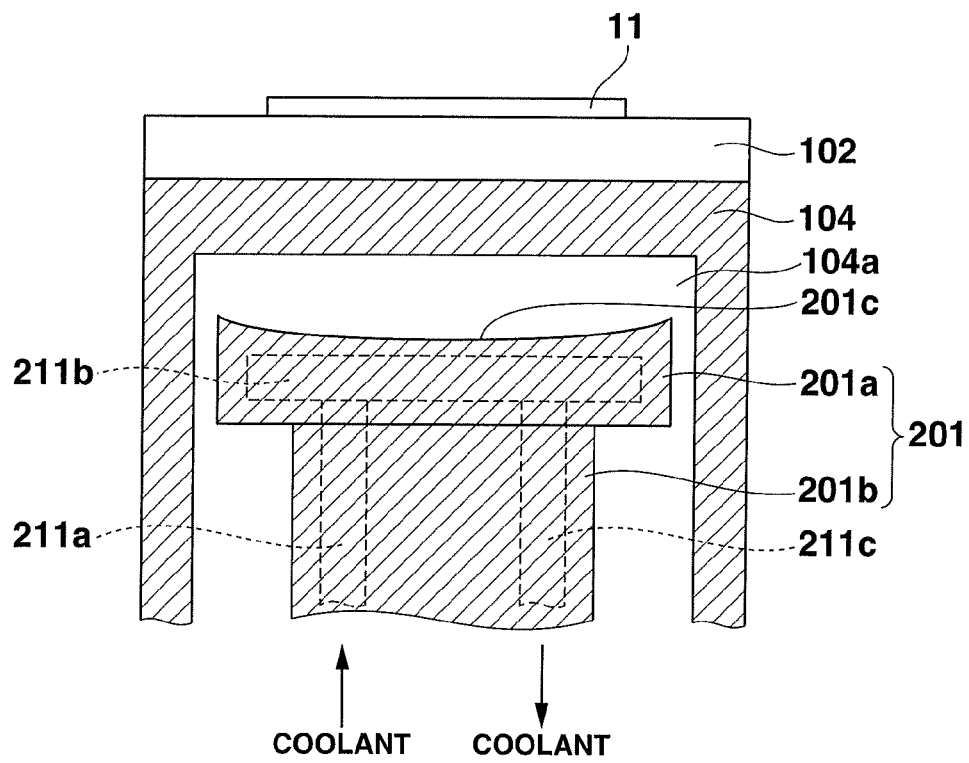
FIG. 2B is a cross-sectional view illustrating the configuration example of the cooling part.

A configuration example of the deposition apparatus 100 according to the embodiment of the present invention is illustrated in FIGS. 1 to 3.

The deposition apparatus 100 comprises, as illustrated in FIG. 1, a chamber 101, anode 102, cathode 103, stage 104, exhaust system 106, spectral luminance meters 107 and 108, control part 130, power supply 131, cooling part 201, and cooling system 202.

Figure 4:
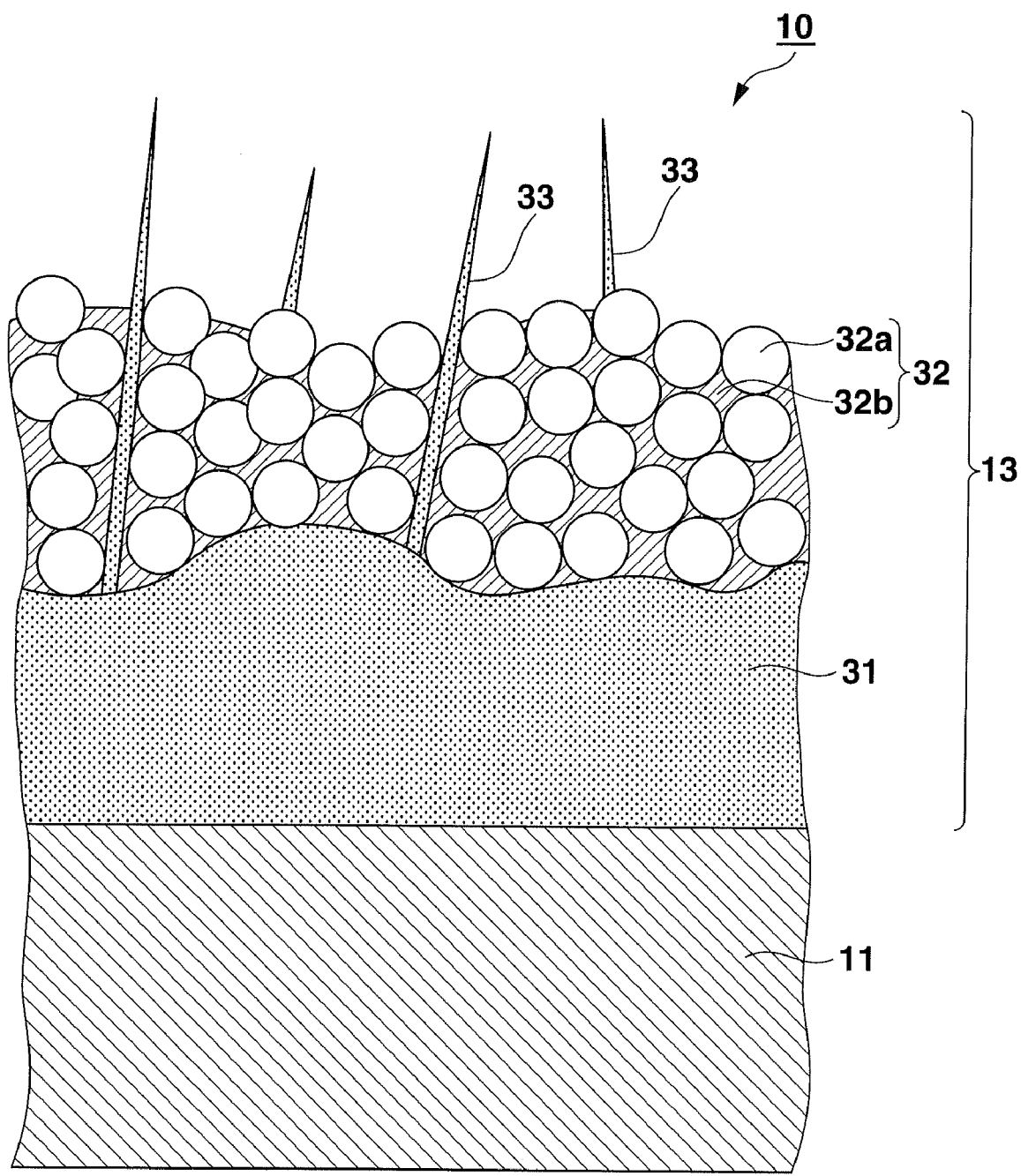
FIG. 4 is a cross-sectional view schematically illustrating a field emission type electrode deposited by a deposition method and the deposition apparatus of the present embodiment.
Figure 5:
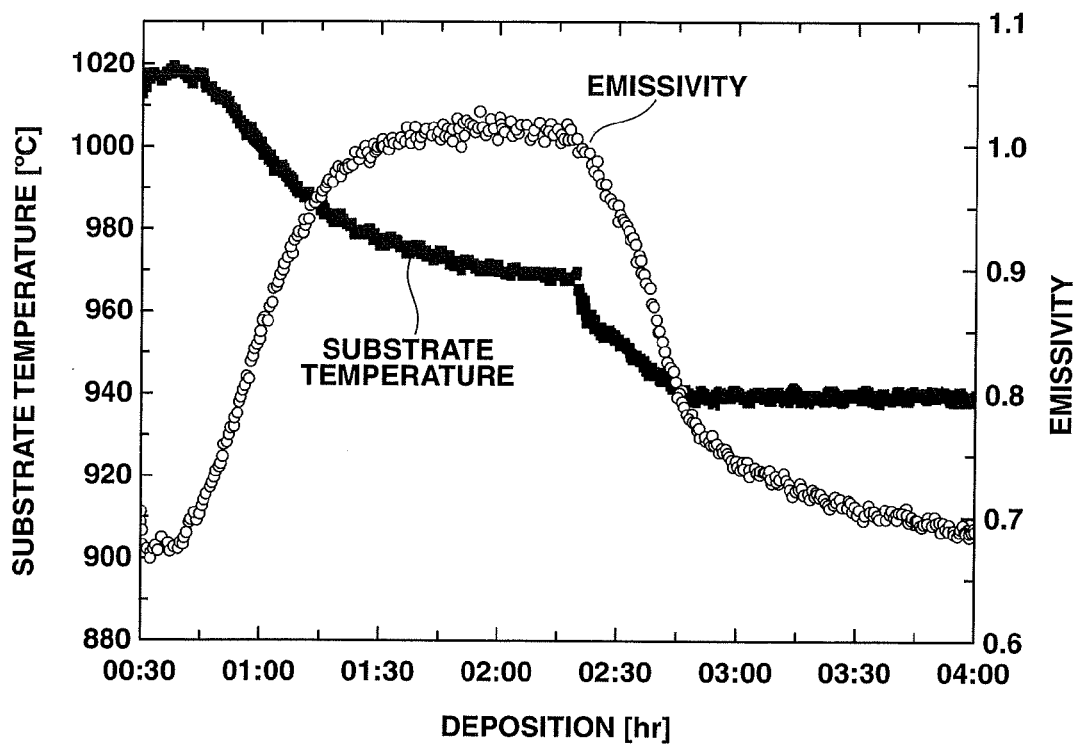
FIG. 5 is a graph illustrating variation in temperature upon deposition of an electron emission film.

Also, in the deposition apparatus 100 according to the embodiment of the present invention, an electron emission film for a field emission type electrode schematically illustrated in FIG. 4 is deposited, as will be described later in detail. The field emission type electrode 10 comprises a substrate 11 and the electron emission film 13 as illustrated in FIG. 4. The electron emission film 13 comprises a carbon nanowall (CNW) 31, nanodiamond (ND) film 32, and needle-like carbon rods 33. The carbon nanowall 31 is a substance in which a number of graphene sheets are aggregated. Also, the nanodiamond film 32 incorporates a plurality of nanocrystal-line diamond particles having a crystalline diameter of the order of nanometers, which are continuously deposited on the CNW 31. The needle-like carbon rod 33 is made of graphite, and some of the needle-like carbons 33 are grown from the carbon nanowall 31 and of a needle-like shape.

The chamber 101 shields a substrate 11 from outside air. Inside the chamber 101, the stage (placing stage) 104 made of steel is arranged, and on the stage 104, the anode 102 having a circular planar shape is installed. Also, the chamber 101 is provided with windows 101a and 101b, through which the inside of the chamber 101 can be observed. In the windows 101a and 101b, sheets of heat resistant glass are fitted, and thereby airtightness inside the chamber 101 is maintained. Outside the window 101a, the spectral luminance meter 107 is installed. Also, outside the window 101b, the spectral luminance meter 108 is arranged, and measures a spectrum from the substrate 11 through the window 101b to analyze and evaluate a substrate temperature and emissivity. Further, through a gas supply pipeline 105a, source gases such as $CH_4$ and $H_2$ are introduced into the chamber 101, and exhausted from the chamber 101 through an exhaust pipeline 105b by the exhaust system 106, and thereby a pressure inside the chamber 101 is adjusted. Each of the pipelines 105a and 105b passes through a hole provided through the chamber 101. A gap between the hole and an outer circumference of each of the pipelines 105a and 105b is sealed by a sealing material to thereby ensure the airtightness inside the chamber 101.

The control part 130 is connected to the spectral luminance meter 108 and variable power supply 131 through signal lines (not shown). After being activated, the control part 130 calculates a temperature of the substrate 11 from a spectrum measured by the spectral luminance meter 108, and adjusts a voltage or current value between the anode 102 and the cathode 103 such that the temperature of the substrate 11 becomes equal to a predetermined value. As described, the control part 130 controls the voltage or current value between the anode 102 and the cathode 103 to thereby control a surface temperature of the substrate 11.

The anode 102 is installed on the stage 104. Also, the substrate 11 is placed on the anode 102. The anode 102 is formed of metal having high thermal conductivity and high melting point, such as molybdenum (thermal conductivity of 138 W/m·K, and melting point of 2620° C.). Because molybdenum is high melting point metal characterized in that amorphous carbon is unlikely to be deposited on a molybdenum surface in deposition apparatus for depositing a carbon based material, similarly to iron group metal or the like, it does not change a contact area between the cooling part and the other member in the deposition process, and is therefore suitable as the material.

The cathode 103 is installed so as to be opposed to the anode 102. The cathode 103 is formed with a pipeline 103a, into which coolant consisting of water, calcium chloride, and the like is flowed to cool the cathode 103 down to a temperature (500° C. or less) at which a deposit to be an originating point of spark discharge is not deposited on the cathode. Also, when voltage is applied between the anode 102 and the cathode 103, a positive column containing active species (radicals) of the source gases is generated above the anode 102 as indicated by a dotted line in FIG. 1.

The stage 104 is installed inside the chamber 101, and installed with the anode 102 on an upper surface thereof. Also, the stage 104 is provided with a closed space 104a, inside which the cooling part 201 is provided. The cooling part 201 comprises a cooling head part 201a and a tubular part 201b, and is configured to be vertically movable by an unshown transfer mechanism. By bringing the cooling part 201 close to or into abutting contact with a lower surface of the stage 104, the stage 104 is cooled, and then the anode 102 and substrate 11 are cooled. Note that, for convenience of illustration, the upper surface of the stage 104 is flat in FIG. 1; however, more properly, it may be of a convex shape toward the anode 102 side because of thermal stress due to a difference in temperature between the inside and outside of the chamber 101, and a difference in pressure through the stage 104 between the inside of the chamber 101 and the space 104a inside the stage 104, and along with this, the lower surface of the stage 104 may also be of a convex shape toward the anode 102 side.

The cooling part 201 is provided inside the space 104a of the stage 104 as illustrated in the diagram, and cools the substrate 11 through the stage 104 and anode 102. The cooling part 201 comprises the cooling head part 201a and tubular part 201b, and is formed with a concave part 201c on a surface of the cooling head part 201a opposed to the stage 104. The concave part 201c of the cooling part 201 is formed such that an inner circumferential edge and outer circumferential circle thereof form concentric circles with being fitted to the shape of the anode 102. The cooling part 201 is formed of metal having high thermal conductivity, such as copper. The cooling part 201 is vertically movable by the unshown transfer mechanism, and comes into abutting contact with or close to the stage 104 to thereby cool the stage 104. Based on this, the stage 104 subjected to the abutting contact cools the anode 102 located thereon, and further the anode 102 draws heat of the substrate 11. A density of active species that is generated during the plasma CVD in the deposition apparatus 100 and contributes to the formation of the ND film is higher in a central region of the positive column, and lower in a peripheral region of the positive column. The substrate 11 is placed such that the central region of the positive column is positioned in the center (center of gravity) of the substrate 11. At this time, the cooling part 201 is arranged such that the center of the cooling part 201 is positioned coaxially with the center (center of gravity) of the substrate. The deposition apparatus 100 is configured such that the deposition is performed with the positive column covering not only a central area of the substrate 11 but also corner areas 11a. In the corner areas 11a, which are the most distant areas from the center of the substrate 11, the density of the active species contributing to the formation of the ND film is lower than that in the center of the substrate 11, and film property cannot be made homogeneous with that in the center of the substrate 11 at the same temperature. However, by installing the cooling part 201 to provide a configuration in which more heat is likely to be transferred from the peripheral areas of the substrate 11 placed on the anode 102 to conform the film property in the area where the density of the active species contributing to the formation of the ND film is lower to that in the area where the density of the active species contributing to the formation of the ND film is higher, a temperature gradient is generated between the areas where the density of the active species contributing to the formation of the ND film on the substrate 11 is high and that is low. By increasing temperature of the central area of the substrate and decreasing temperature of the peripheral areas of the substrate in this manner to provide the gradient of the substrate temperature correspondingly to a gradient of the density of the active species on the substrate, the deposition can be performed with the film property being uniform within the surface of the substrate.

Figure 9A:
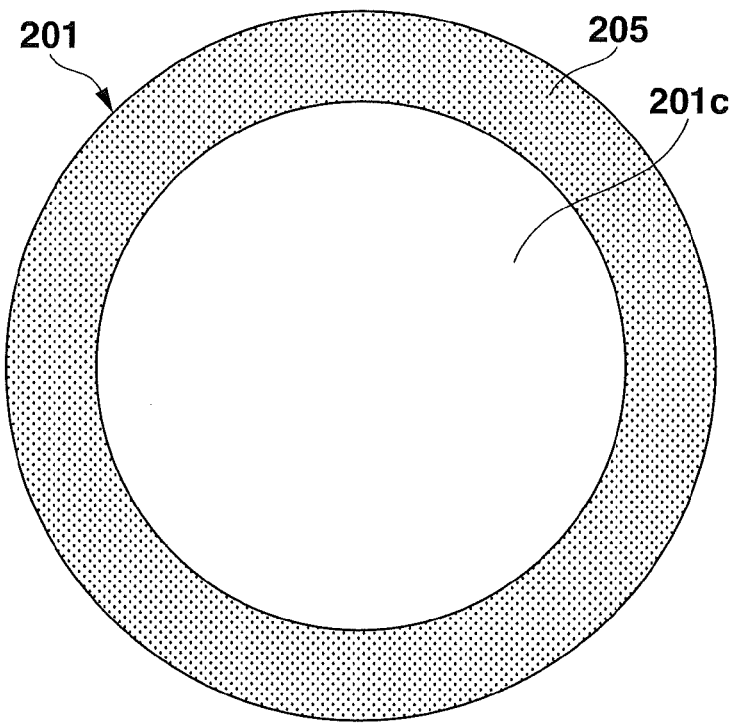
FIGS. 9A and 9B are diagrams illustrating another embodiment of the present invention.
Figure 9B:
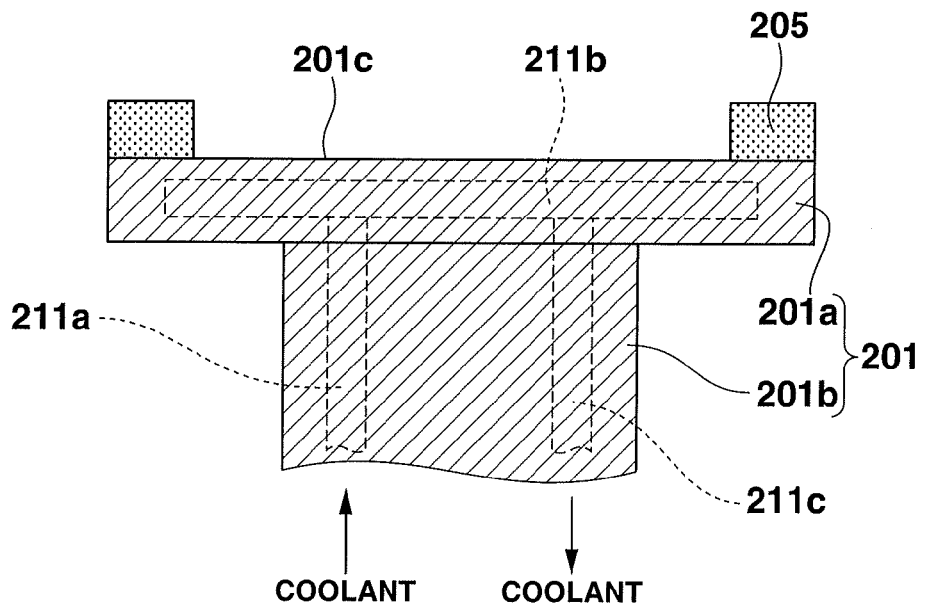

In addition, if the anode 102 or the back surface of the stage 104 is gradually transformed by thermal stress or the like, the contact surface may be unstable. For this reason, as illustrated in FIG. 9, preferably, by arranging a ring 205 such as a graphite sheet, which has both heat resistance and flexibility, on the cooling head part 201a of the cooling part 201, a change in contact area by such transformation, i.e., a change in thermal conductance can be relieved. Note that a thickness of the ring 205 is preferably a few mm.

Figure 10A:
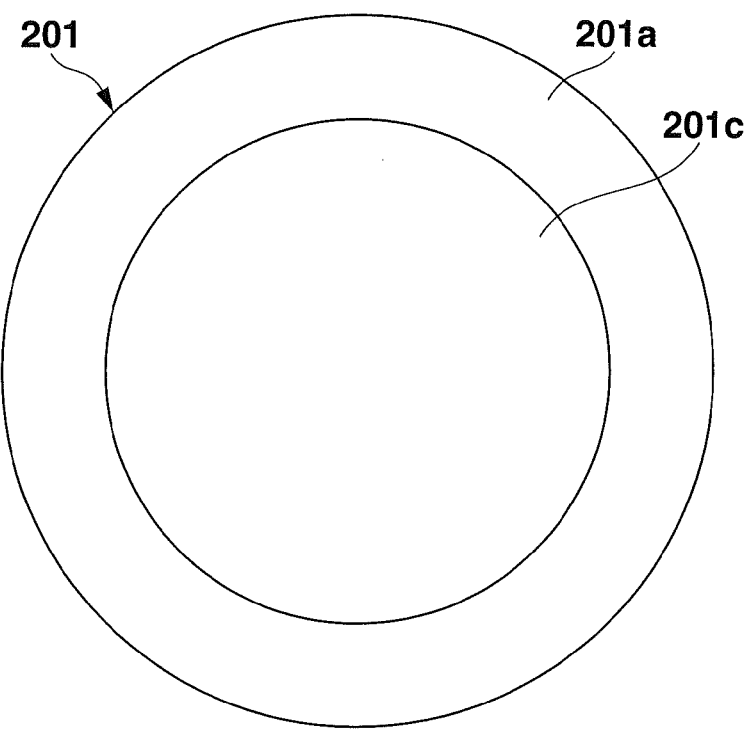
FIGS. 10A and 10B are diagrams illustrating another embodiment of the present invention.
Figure 10B:
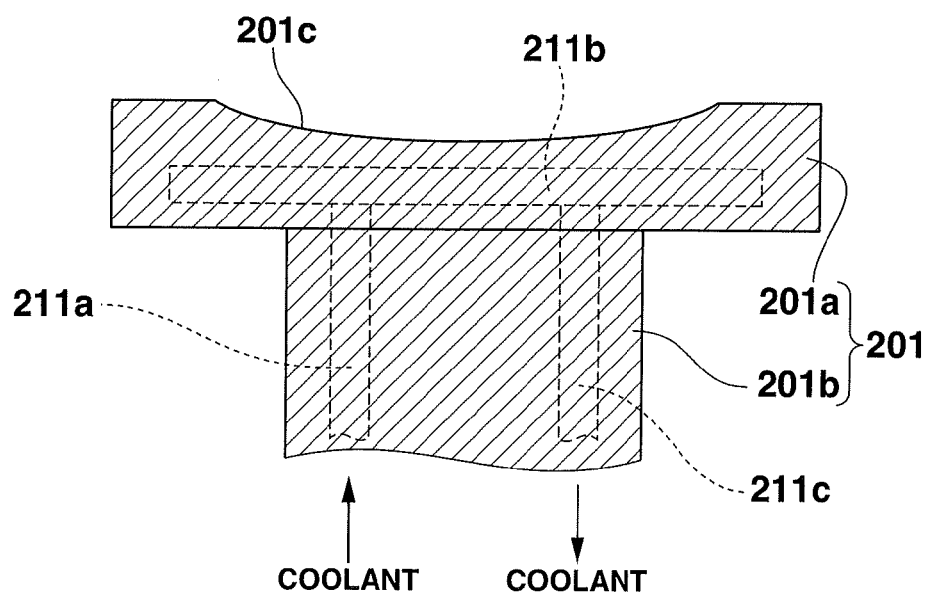
Figure 11A:
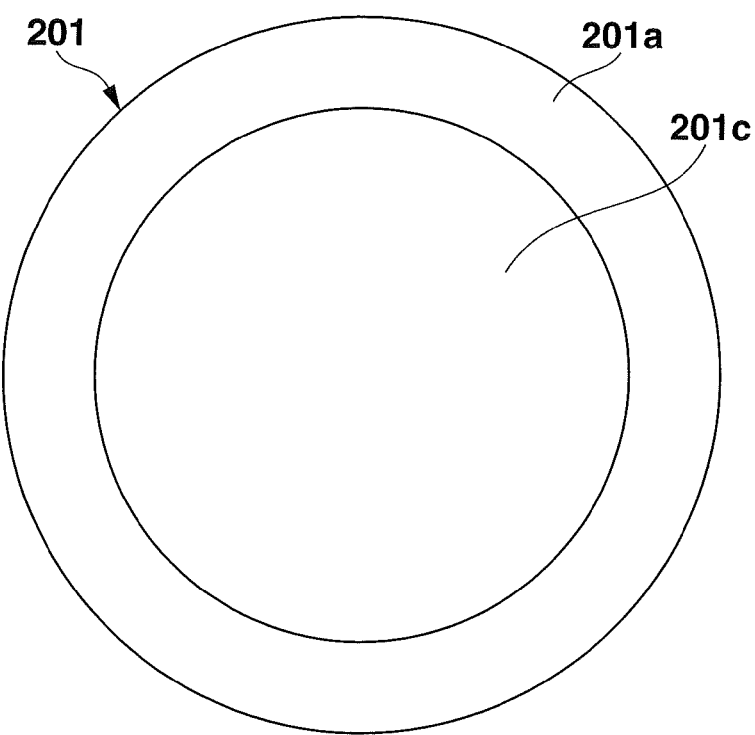
FIGS. 11A and 11B are diagrams illustrating another embodiment of the present invention.
Figure 11B:
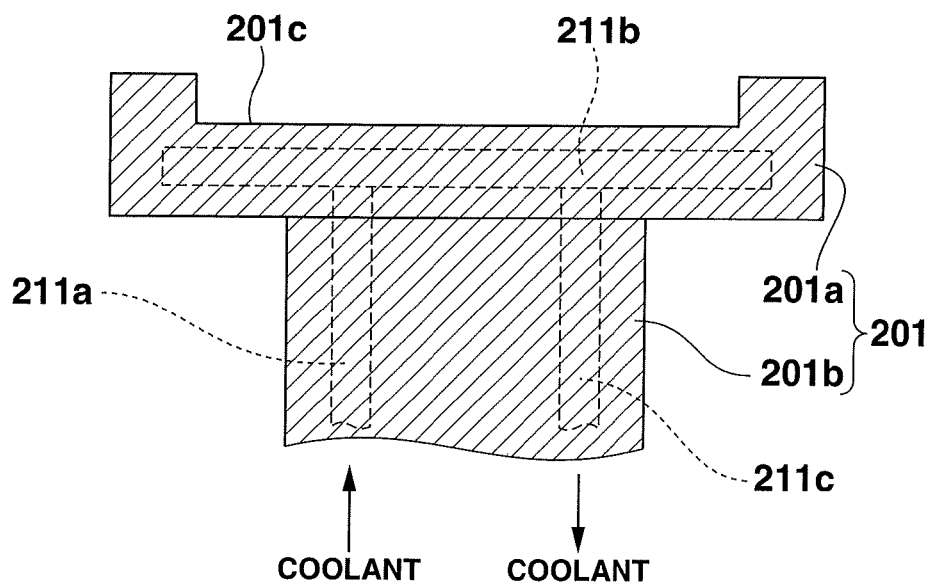

Also, a configuration of the cooling part 201 is not limited to the above-described one if it can cool the substrate from the peripheral areas. For example, as illustrated in FIGS. 10A and 10B, a diameter of the concave part 201c may be decreased to bring not only the circumferential edge of the cooling head part 201a but also the peripheral area into abutting contact with the stage 104. Also, for example, as illustrated in FIGS. 11A and 11B, the concave part of the cooling head part 201a may be formed to have a square-shaped cross section and circular planar shape. Further, the substrate may be cooled from the peripheral areas by forming a plurality of concave parts as illustrated in FIGS. 10A, 10B, 11A and 11B to increase a density of the concave parts in the central region higher than that in the peripheral region, or forming a plurality of concave parts only in the central region, or taking the other measures to increase a contact area at which the peripheral area of the cooling head part 201a comes into contact with the placing stage, higher than an area at which the central area comes into contact.

Figure 3A:
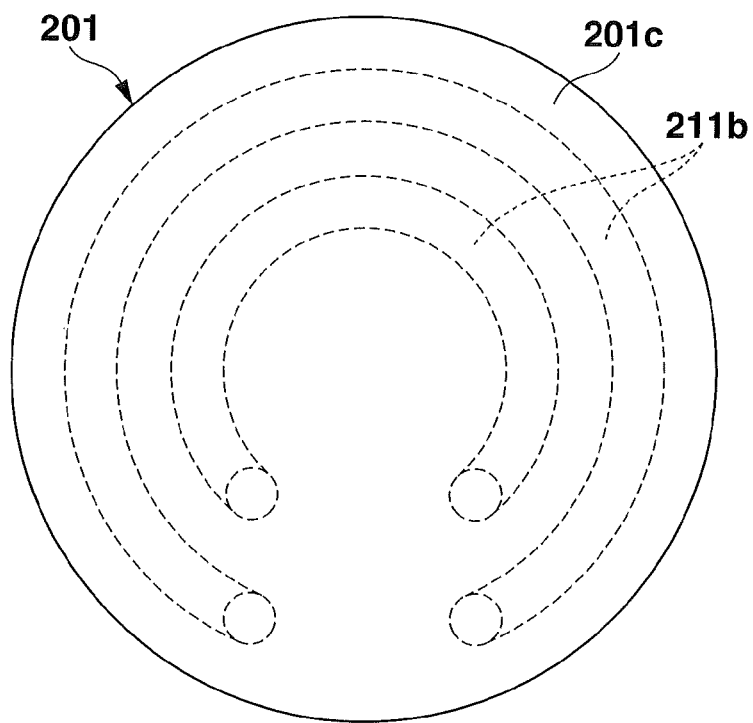
FIG. 3A is a plan view illustrating pipelines in the cooling part.
Figure 3B:
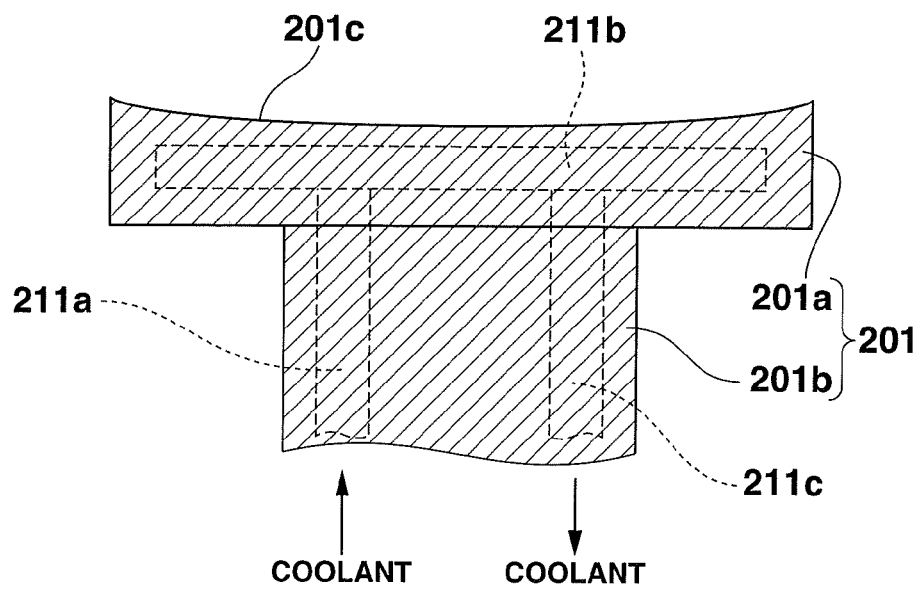
FIG. 3B is a cross-sectional view illustrating the pipelines in the cooling part.

Also, as illustrated in FIGS. 3A and 3B, the cooling head part 201a and tubular part 201b of the cooling part 201 are formed with a pipeline 211b, and pipelines 211a and 211c, respectively, and the pipelines 211a, 211b, and 211c are connected to each other. As described, the coolant such as cooled water or calcium chloride solution is circulated so as to be flowed into the pipelines 211a to 211b, and discharged from the pipeline 211c, and thereby cools the entire cooling part 201. The cooling head part 201a is, as illustrated in FIGS. 3A and 3B, formed with the pipeline 211b. The pipeline 211b is formed in a substantially circular shape (arc shape) correspondingly to the shape of the upper surface of the stage 104 so as to cool the stage 104 to uniform temperature, and a plurality of the pipelines 211b are concentrically provided around a pipeline 213 for helium. Also, the pipelines 211a and 211c are formed so as to pass through the tubular part 201b, and respectively connected to the cooling system 202. The coolant discharged from the pipeline 211c is cooled again by the cooling system 202, and then circulated so as to be carried into the pipeline 211a again.

The spectral luminance meter 107 is used to evaluate a relative density distribution of active species from an emission spectrum of plasma radiation. The spectral luminance meter 107 is set at an angle not influenced by radiation from the substrate 11 as much as possible, i.e., at an angle parallel to a planar direction of the upper surface of the substrate 11. Also, it is considered reasonable that the relative density of CH to be evaluated has a gradient in a direction normal to the upper surface of the substrate 11, and therefore light from plasma close to the upper surface of the substrate 11 as much as possible, more preferably light from plasma at a position 1 mm above the upper surface of the substrate 11 is measured.

The spectral luminance meter 108 is one for measuring thermal radiation from the substrate 11, and measures a temperature of the substrate 11 by focusing on the upper surface of the substrate 11 at a predetermined angle (e.g., 15°) to the planar direction of the upper surface of the substrate 11 through the window 101b provided through the chamber. In the present embodiment, a substrate temperature and emissivity are simultaneously evaluated by fitting, on the basis of a nonlinear least square method, the Planck's radiation equation making temperature and emissivity have degrees of freedom in variation of radiation capacity of the substrate and an expression linearly combining a spectrum measured by the spectral luminance meter 108 at a temperature at which the Planck radiation takes a value of a measurement error or less to the radiation light from the substrate upon deposition process in which the both are superimposed. According to this temperature measurement method, a substrate temperature in the deposition process can be sequentially measured, and therefore information on the substrate temperature can be fed back to control the deposition on the substrate. Specifically, the following four steps are included to evaluate a temperature and emissivity of the substrate: (1) the step of measuring the spectrum of plasma radiation by the spectral luminance meter 108 in order to preliminarily measure plasma radiation serving as noise for the substrate temperature; (2) the step of selecting a wavelength region required for the fitting; (3) the step of determining the plasma radiation spectrum; and (4) the step of fitting the theoretical formula based on the Planck's radiation law and the expression linearly combining the plasma radiation spectrum to the measured spectrum on the basis of the nonlinear least square method.

Next, the deposition process is described.

In the deposition process, for example, a nickel plate is first cut out as the substrate 11, and then sufficiently degreased and ultrasonic-cleaned with ethanol or acetone.

The substrate 11 is placed on the anode 102 of the deposition apparatus 100 having the configuration exemplified in FIG. 1. After the substrate 11 has been placed, the chamber 101 is depressurized with use of the exhaust system 106, and then hydrogen gas and compound gas in which carbon is contained in a composition consisting of methane, and the like (carbon-containing compound) are introduced from the gas supply pipeline 105a.

The compound gas in which carbon is contained in the source gas composition is preferably within a range of 3 to 30 vol. % of the total. For example, a methane flow rate is set to 50 sccm, hydrogen flow rate to 500 sccm, and total pressure to 0.05 to 1.5 atm, preferably to 0.07 to 0.1 atm. Also, DC power supply is applied between the anode 102 and the cathode 103 to generate plasma, and a state of the plasma and a temperature of the substrate 11 are controlled.

Upon deposition of the carbon nanowall 31, the deposition is performed for a predetermined time period under the condition that a temperature in a location on the substrate 11 where the carbon nanowall 31 is deposited is set to 900 to 1100° C. The temperature is evaluated from a spectrum measured by the spectral luminance meter 108 on the basis of the above-described procedure. At this time, the cooling part 201 is sufficiently separated from the anode 102 to avoid an influence on temperature of the anode 102.

After the underlying carbon nanowall 31 has been sufficiently deposited, the anode 102 is continuously cooled by elevating the cooling part 201 by, for example, 100 mm, which is at a temperature further below that of the plasma heated anode 102, to bring it close to or into abutting contact with the stage 104 without changing the gas atmosphere. At this time, because the anode 102 on which the substrate 11 is placed is installed on the stage 104, the substrate 11 is cooled by the cooling part 201 through the anode 102 and stage 104. Also, at this time, in the present embodiment, because the concave part 201c is formed on the surface of the cooling head part 201a of the cooling part 201, which is opposed to the stage 104, only the circumferential edge of the cooling head part 201a comes into abutting contact with the stage 104. By providing a configuration based on this in which more heat is transferred from the peripheral areas of the substrate 11 placed on the anode 102, the temperature gradient in the substrate 11 is generated between the areas where the density of the active species contributing to the formation of the ND film is high and that is low.

As described, the substrate 11 placed on the anode 102 is cooled, and consequently the surface of the substrate 11 is rapidly cooled to a temperature appropriate for deposition of the plurality of diamond nanoparticles, which is 10° C. or more lower than that upon deposition of the carbon nanowall. Note that, preferably, to stably maintain the plasma, an applied voltage or current value between the anode and the cathode is not changed too much at timing when the cooling part is brought close to or into abutting contact with the stage 104.

After the growth of the carbon nanowall 31 has been suppressed due to the rapid cooling of the substrate 11, the plurality of diamond nanoparticles 32a having a particle size of approximately 5 to 10 nm start to grow on the carbon nanowall 31, and then the diamond nanoparticle 32a growth becomes dominant in place of the carbon nanowall 31 growth. Subsequently, the nanocrystalline diamond film 32 having a layered structure consisting of aggregates of the diamond nanoparticles 32a is formed, and in regions where the aggregates of the diamond nanoparticles 32a are not formed, i.e., in gaps between the aggregates of the diamond nanoparticles 32a as illustrated in FIG. 4, needle-like carbon rods 33 into which a surface of the carbon nanowall 31 is transformed are grown and formed such that tips thereof protrude from a surface of the nanocrystalline diamond film 32. Originating points of the needle-like carbon rods 33 are mainly at the surface of the carbon nanowall 31, but the needle-like carbon rods 33 may originate at the other points. However, as will be described later, the needle-like carbon rod 33 grown from the carbon nanowall 31 has larger mechanical strength because an inside thereof is filled with a graphite layer core, and also has a rod like structure in which an electric field is likely to be concentrated, and therefore electrons can be stably emitted from the chip of the needle-like carbon rod 33 grown from the carbon nanowall 31.

Also, based on the installation of the cooling part 201 for cooling the peripheral parts of the substrate 11, a temperature distribution on the substrate can be controlled between the substrate central and peripheral parts within the substrate 11, as compared with a configuration in which the cooling part 201 is not installed. In a back surface area of an opposed surface area of the anode 102 opposed to the central part of the substrate 11, i.e., opposed to the area where the density of the active species contributing to the formation of the ND film is high, the cooling part 201 is not brought into contact with or close to the stage 104, and between the cooling part 201 and the stage 104, there exists only gas. Gas has poor thermal conductivity as compared with solid, and therefore heat transferring from the plasma to the stage 104 through the substrate 11 and anode 102 is mostly transferred to the cooling part 201 through a circumferential edge 104a of the stage, which is the most distant area from the central part of the stage 104. For this reason, a heat flow, i.e., a temperature gradient from the central part to outer edge of the stage is generated, and due to this, the temperature gradient between the central and corner parts of the substrate 11, which are respectively located above the center and outer edge of the stage, is also generated. Accordingly, based on the installation of the cooling part 201, a temperature of the corner parts 11 where the density of the active species contributing to the formation of the ND film is lower than that in the central part of the substrate 11 can be further decreased.

Note that the temperature measurement procedure used for the deposition also evaluates an emissivity simultaneously with the measurement of a substrate temperature as a fitting parameter for the nonlinear least square method. The emissivity is also influenced by a transmittance or the like of the glass provided for the window, and therefore takes a relative value; however, in the present embodiment, the underlying film is the carbon nanowall, and the sufficiently grown carbon nanowall has an emissivity of 1, so that by setting to 1 a value of relative emissivity at the time when the emissivity reaches a plateau due to the carbon nanowall growth, an accurate emissivity can be evaluated in the process of formation of the diamond nanoparticles on the carbon nanowall.

At the final stage of the deposition, the voltage applied between the anode 102 and the cathode 103 is stopped; subsequently the supply of the source gases is stopped; nitrogen gas is supplied into the chamber 101 as purge gas to recover to normal pressure; and then the substrate 31 is taken out with temperature being recovered to normal temperature.

Next, the electron emission film deposited with use of the deposition apparatus of the present embodiment is described in detail.

As schematically illustrated in FIG. 4, the electron emission film 13 has: the carbon nanowall 31 in which a plurality of curved petal-shaped (fan-like) carbon flakes having a graphite structure are randomly connected to one another with uprising; nanocrystalline diamond film (carbon film) 32 that is a layer containing the plurality of nanocrystalline diamond particles and continuously deposited on the CNW 31; and needle-like carbon rods 33 protruding from the surface of the nanocrystalline diamond film 32.

The surface of the CNW 31 before the deposition of the nanocrystalline diamond film 32 consists of the plurality of curved petal-shaped (fan-like) carbon flakes randomly connected to one another with uprising. The CNW 31 has a thickness of, for example, 1 to 500 nm. The CNW 31 is made of dense and high purity graphite having sp2 bonds, and each of the carbon flakes of the CNW 31 contains a few layers to a few tens layers of graphene sheets having a lattice spacing of 0.34 nm. The graphene sheet has sp2 bonds, and exhibits electrical conductivity. Accordingly, the CNW 31 exhibits electrical conductivity.

Also, from the CNW 31, the needle-like carbon rods 33 are grown. Further, around the needle-like carbon rods 33, the diamond nanoparticles 32*a* of the nanocrystalline diamond film 32 are arranged. Because the needle-like carbon rods 33 are grown from the CNW 31 as described, the needle-like carbon rods 33 and the CNW 31 are continued, and therefore electrons are efficiently supplied from the electrically conductive CNW 31 to the needle-like carbon rods 33, and well emitted from the needle-like carbon rods 33.

The nanocrystalline diamond film 32 is of a layered structure containing the plurality of sp3-bonded diamond nanoparticles having a particle size of 5 to 10 nm, and on the surface thereof, a few tens to a few hundreds of diamond nanoparticles are aggregated as schematically illustrated in FIG. 4 to form textures like a bamboo leaf. Note that, in the nanocrystalline diamond film (carbon film) 32, in addition to pure graphite and the diamond particles, an intermediate phase having both sp2 and sp3 bonds is present, and the nanocrystalline diamond film 32 has a complex of them, so that, to be exact, the nanocrystalline diamond film 32 should be called a carbon film; however, for convenience of description, it is called the nanocrystalline diamond film. Preferably, a diameter of the aggregate in the nanocrystalline diamond film 32 is approximately 1 to 5 μm, and the aggregate is grown to the extent of covering the CNW 31. The surface of the nanocrystalline diamond film 32 is less uneven than that of the underlying CNW 31, and relatively smooth. Also, at interfaces (grain boundaries) between the respective aggregates in the nanocrystalline diamond film 32, gaps are formed as schematically illustrated in FIG. 4. In the process of the nanocrystalline diamond film 32 growth, the nanocrystalline diamond film 32 serves as a steric barrier to apply stress to the CNW 31 attempting to continuously grow under the film 32, and consequently parts of the CNW 31 are grown in a needle-like shape to form the needle-like carbon rods 33 protruding through the gaps. Accordingly, the nanocrystalline diamond film 32, and the gaps between the aggregates in the nanocrystalline diamond film 32 have an effect of metamorphosing the CNW 31 growth to form a large number of the needle-like carbon rods 33.

On the main surface of the nanocrystalline diamond film 32, there exist not only diamond but also the needle-like carbon rods 33 and after-mentioned crystalline graphite such as a phase 32*b* dominated by sp2 bonds, and the surface of the nanocrystalline diamond film 32 is not a complete insulator but exhibits electrical conductivity to the extent that the needle-like carbon rods 33 can be conductive and is therefore excellent in electron emission characteristics.

The electron emission characteristics of the electron emission film 13 provided with such characteristics are influenced by deposition conditions such as an active species density due to plasma in the deposition apparatus 100.

Figure 6:
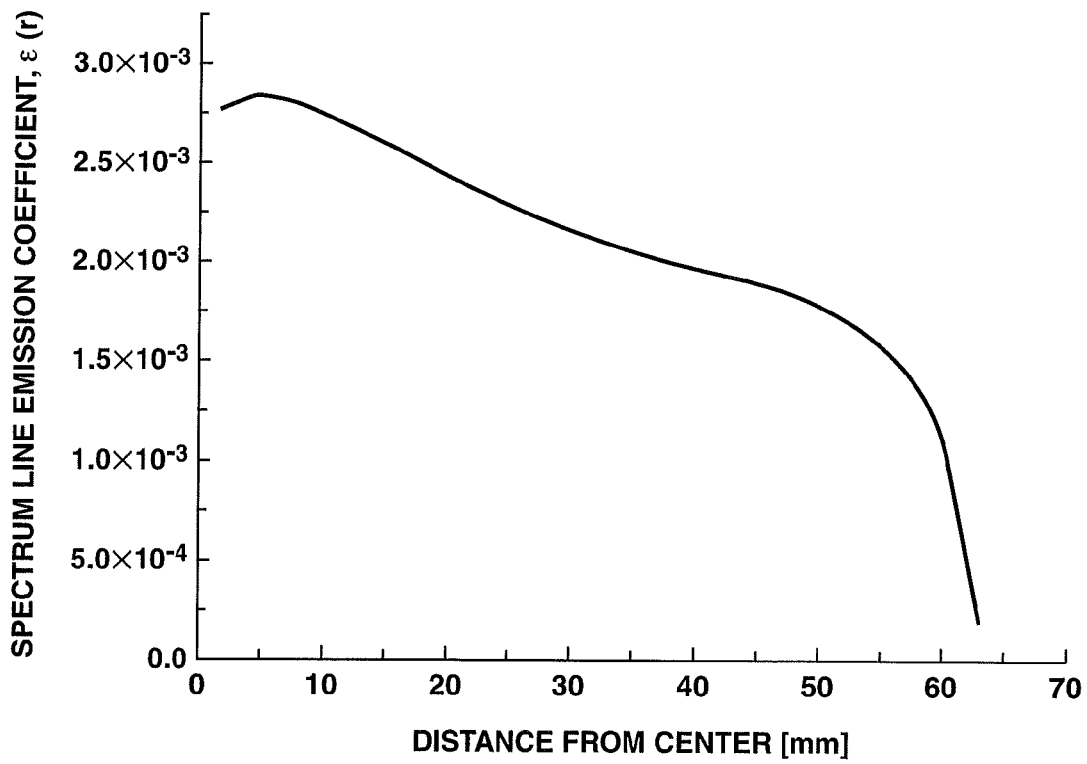
FIG. 6 is a graph illustrating a relationship between a distance from the center of a substrate and a spectrum line emission coefficient.

Specifically, as illustrated in FIG. 6 that is a graph illustrating a relationship between a distance from the center of the substrate and a spectrum line emission coefficient, the active species density in the deposition apparatus tends to decrease from the center to peripheral area of the substrate (positive column). For this reason, if a substrate temperature is adjusted with pressure, applied power, and the like so that the ND film having high electron emission characteristics can be deposited in the central area where a large number of the active species are present, the film not exhibiting electron emission due to the difference in deposition conditions is formed in the areas where the number of the active species is relatively small.

Figure 7:
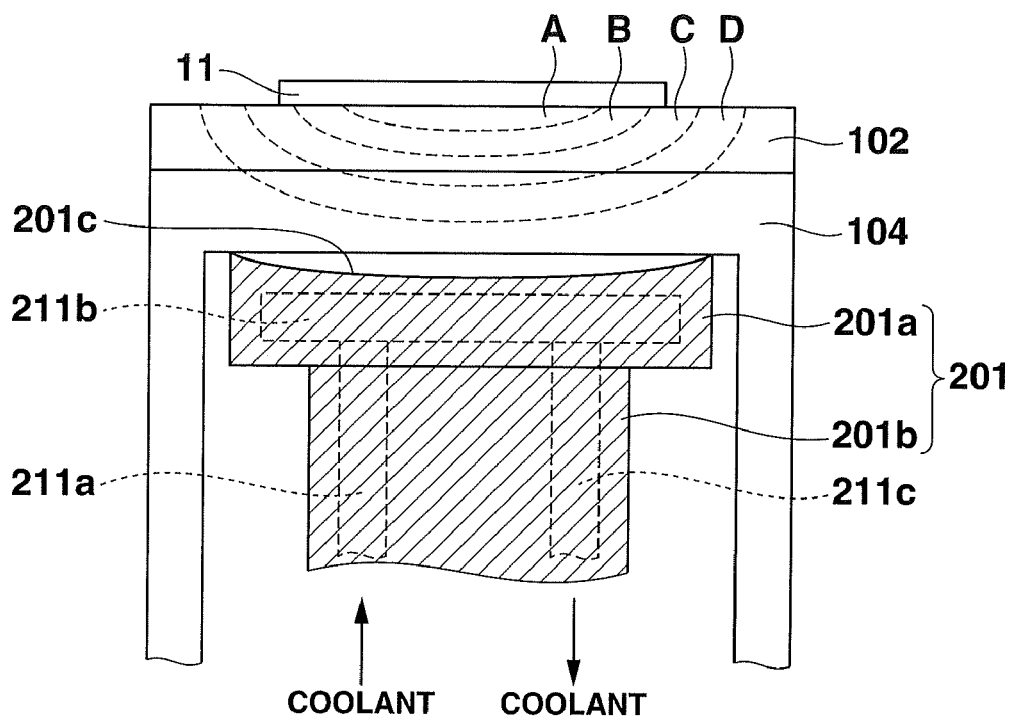
FIG. 7 is a diagram schematically illustrating a heat flow near the substrate in the present embodiment.
Figure 8:
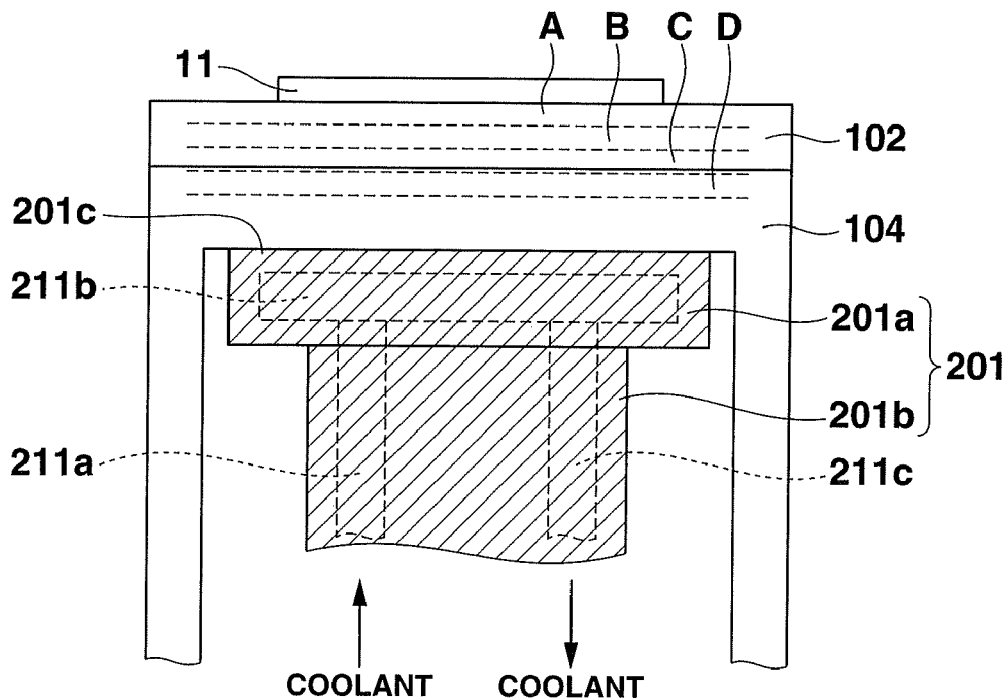
FIG. 8 is a diagram schematically illustrating a heat flow near a substrate in a configuration in which an upper surface of the cooling part is flatly formed.

In the present invention, by providing the cooling part having the concave part, which is not brought into abutting contact with the placing stage in the area corresponding to the central part of the substrate, i.e., the area where the density of the active species contributing to the formation of the ND film is high, but is brought into contact with the placing stage in the area corresponding to the area where the density of the active species contributing to the formation of the ND film is low, a temperature gradient within the surface of the substrate can be controlled. For example, as illustrated in FIG. 8, in deposition apparatus having a cooling part of which a top of a cooling head is flattened to substantially equalize a height of a surface in contact with the placing stage between regions corresponding to the central and peripheral parts of the substrate, isothermal lines are substantially parallel to the planar direction of the substrate surface, and therefore it is difficult to generate a desired temperature gradient between the central and peripheral parts of the substrate. Note that regions A, B, C, and D sectioned by the isothermal lines are in descending order of temperature. On the other hand, in the configuration of the present embodiment, provided with the cooling part, isothermal lines as illustrated in FIG. 7 are achieved. Respective temperature ranges of regions A, B, C, and D in FIG. 7 are the same as those in FIG. 8. That is, because in the cooling head part 201*a*, a part in abutting contact with the back surface of the stage 104 is only the outer circumferential edge, the outer circumferential edge has the largest heat flow and is likely to draw surrounding heat, and therefore temperature of the peripheral part of the substrate, which is a part close to the outer circumferential edge, is further decreased, and that of the central part of the substrate, which is a part distant from the outer circumferential edge, is further increased. As described, by largely changing a shape or size of the cooling part 201, the substrate temperature in the central area of the substrate where a large number of the active species contributing to the formation of the nanodiamond film within the positive column are present, and that in the peripheral area of the substrate where the density of the active species is lower than that in the central area can be adjusted depending on the density of the active species, and therefore the film having uniform film property between the central and peripheral parts can be deposited.

Also, methods generally performed for improving uniformity of a film in deposition by a CVD method include ones in which a substrate is rotated in the growth process, a shape of an electrode is changed, and a substrate temperature is made uniform, and the like. In the method in which the substrate is rotated, there exists a problem that it is difficult to make deposition nonuniformity uniform in a radial direction with respect to a rotational axis. Also, there exists another problem that because the substrate is rotated, a deposition area is increased, and therefore an apparatus size is also increased. Next, in the configuration in which the electrode shape is changed to thereby change a state of plasma distribution, there exists a problem that because the electrode shape is no longer simple, an electric field is likely to be concentrated near the electrode where electric field intensity is increased, and therefore corona discharge or arc discharge disturbing the deposition is likely to occur. Also, in the method in which the substrate temperature is made uniform within a surface of the substrate, an deposition area can be expected to be expanded by this method in the case of the typical MD film; however, in the case of deposition largely influenced by an active species density distribution in plasma, such as the ND deposition, making the substrate temperature uniform rather decreases a uniform deposition area.

On the other hand, in the deposition apparatus of the present invention, by providing the cooling part in order to uniform the film property between the central area of the substrate where the density of the active species contributing to the ND deposition is high and the peripheral areas where the density of the active species contributing to the deposition is lower than that in the central area of the substrate, a heat resistance from the peripheral area of the substrate to the chamber connected with the cooling part or placing stage can be decreased lower than that from the central area of the substrate to the chamber connected with the cooling part or placing stage to cause a heat flow from the central to peripheral areas within the substrate, and to easily generate a substrate temperature gradient depending on an active species density distribution, and thereby the film having good uniformity can be formed within the surface of the substrate. As described above, according to the configuration of the present invention, the apparatus is not complicated because the substrate is not rotated, and also the plasma is easily generated because the shape of the electrode is not changed.

As described, according to the deposition apparatus and deposition method of the present embodiment, the film having good in-plane uniformity can be formed.

The present invention is not limited to the above-described embodiment, but may be variously modified.

Figure 12A:
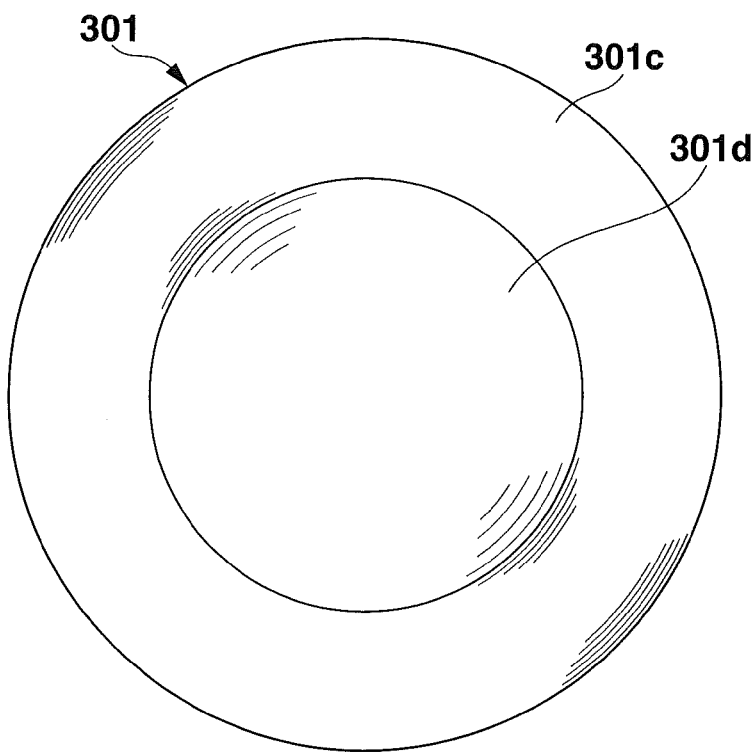
FIGS. 12A and 12B are diagrams illustrating another embodiment of the present invention.
Figure 12B:
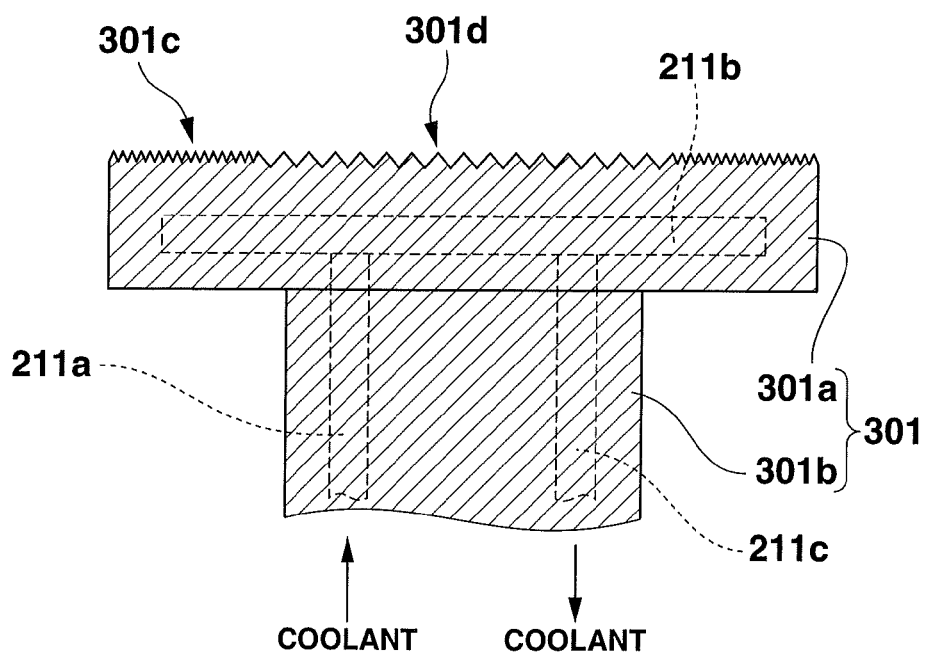

In the above-described embodiment, the configuration in which the area at which the cooling head part 201a of the cooling part 201 is brought into contact with the placing stage is taken as an example to give the description; however, a configuration is not limited to this. For example, as illustrated in FIGS. 12A and 12B, there may be employed a configuration in which by finely and coarsely roughing a peripheral area 301c and central area 301d of a cooling head part 301a of a cooling part 301, respectively, an area (contact area) at which the peripheral area 301c is brought into abutting contact with a stage 104 is made larger than a contact area of the central area 301d. Also, only the central area 301d may be roughed.

Figure 13A:
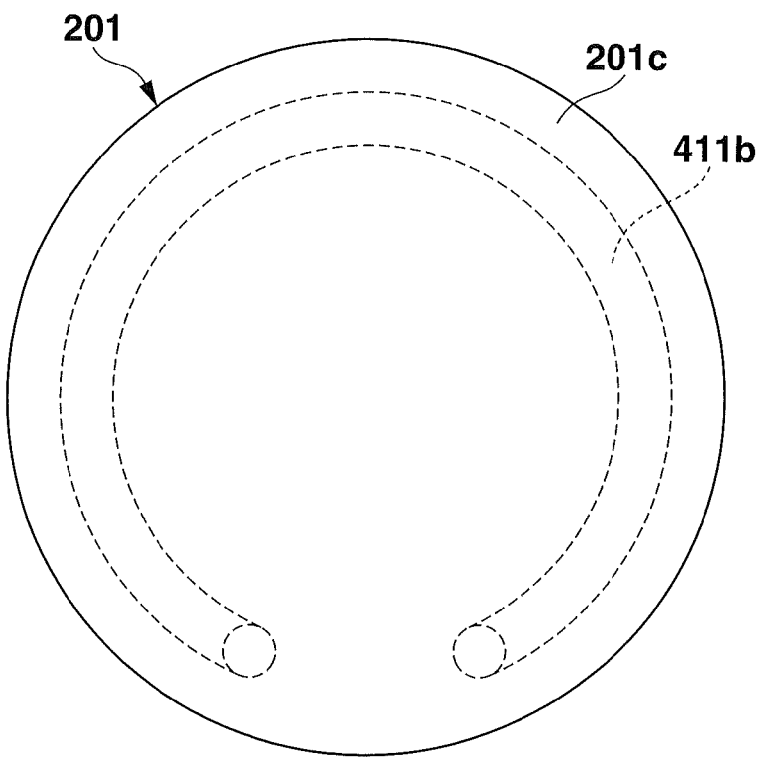
FIGS. 13A and 13B are diagrams illustrating another embodiment of the present invention.
Figure 13B:
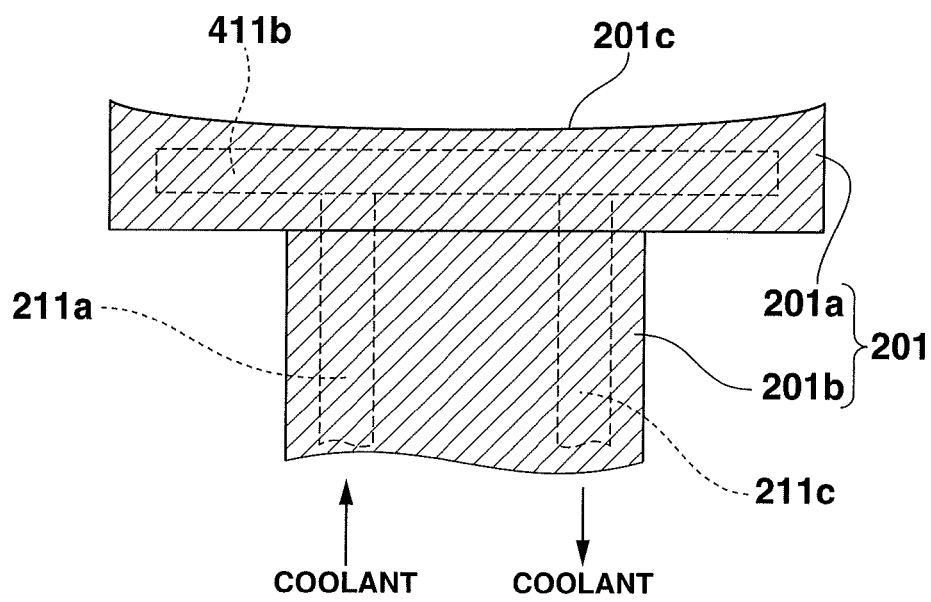

Further, as illustrated in FIGS. 13A and 13B, a pipeline 411b may be formed only in the peripheral area of the cooling head part 201a. In this case, the concave part 201c may be formed as illustrated in FIGS. 10A and 10B or FIGS. 11A and 11B, or the cooling head part may be formed as illustrated in FIGS. 9A and 9B, FIGS. 12A and 12B, or FIGS. 14A and 14B. As illustrated in FIGS. 13A and 13B, by flowing the cooling medium only into the peripheral area, the peripheral area can be further efficiently cooled.

Figure 14A:
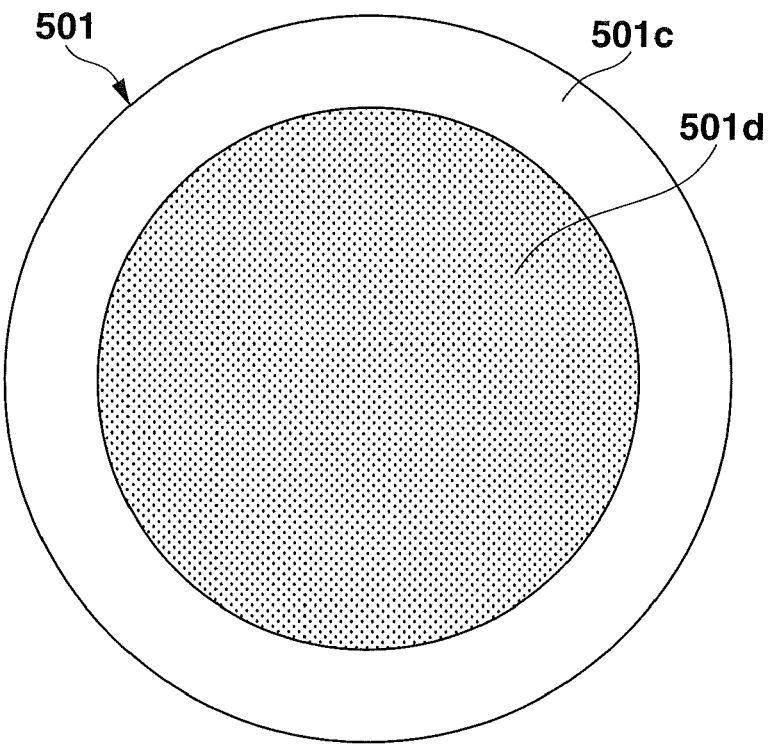
FIGS. 14A and 14B are diagrams illustrating another embodiment of the present invention.
Figure 14B:
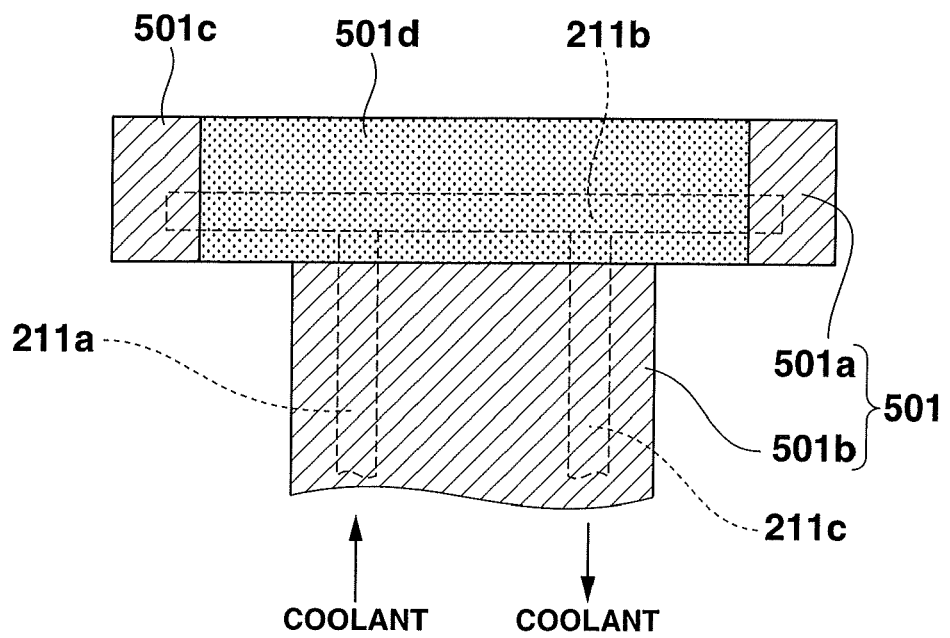

Still further, as illustrated in FIGS. 14A and 14B, a central area 501d of a cooling head part 501a of a cooling part 501 may be formed of a material having low thermal conductivity, for example, $Al_2O_3$, whereas a peripheral area 501c may be formed of a material having higher thermal conductivity than that in the central area, for example, Cu. The thermal conductivity of $Al_2O_3$ is 20 W/(m·K), and that of Cu is 350 W/(m·K), so that more heat is transferred to the placing stage from the peripheral area formed of Cu. Similarly to the above-described embodiment, this enables heat flows from the center to the peripheral areas of the substrate to be generated, resulting in a temperature gradient within the substrate. Note that, besides the two types of materials, three or more types of materials may be combined to generate the heat flows from the center to the peripheral areas of the substrate, resulting in a temperature gradient within the substrate.

Also, as a material for the substrate 11, any material other than nickel may be used if the material can maintain a shape of the substrate 11 at a temperature for forming the CNW or ND film, and the material may include at least any one of Si, iron, cobalt, molybdenum, tungsten, rare earths, copper, silver, gold, and platinum.

Further, a mixing ratio of the source gases, i.e., hydrogen gas and carbon-containing compound, may be appropriately selectively changed.

Still further, in the above-described embodiments, the electron emission type electrode is formed; however, the deposition apparatus of the present invention may also be applied to a case where the other electronic element is formed by continuous plasma CVD, and is effective for the case where composite films having different film properties are continuously formed, or the other case. Also, in each of the above-described embodiments, the anode 102 and the stage 104 are separate bodies; however, they may be integrated to form an anode also serving as a stage.

Figure 15:
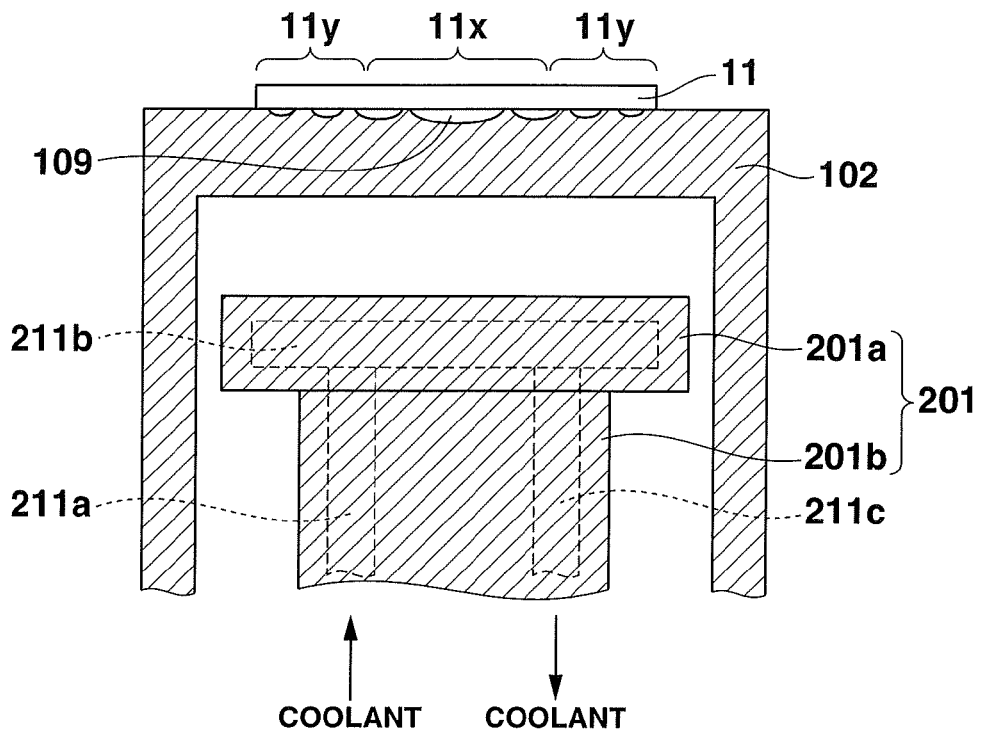
FIG. 15 is a diagram illustrating another embodiment of the present invention.

As another embodiment of the present invention, a part of deposition apparatus in which a substrate 11 is placed on an anode 102 combined with a stage is illustrated in FIG. 15. The anode 102 has a plurality of concaves 109 not in contact with the substrate 11 on a surface thereof brought into contact with the substrate 11. Each of the concaves 109 may be of a semispherical, conical, or polypyramidal shape, or of any other geometrical shape, and the respective concaves 109 may be similar in shape to one another or different in shape from one another. Also, the concaves may be formed as circular grooves, which may be concentrically formed. The plurality of concaves 109 are gradually decreased in size from a region corresponding to a central part 11x of the substrate 11 to that corresponding to a peripheral part 11y of the substrate 11, and therefore a contact area per unit area between the substrate 11 and the anode 102 depending on the concaves 109 in the region corresponding to the peripheral part 11y of the substrate 11 is larger than that between the substrate 11 and the anode 102 depending on the concaves 109 in the region corresponding to the central part 11x of the substrate 11. Also, in a space arising between the concave 109 and the substrate 11, gas that is poorer in thermal conductivity than solid intervenes, and therefore heat from the substrate 11 is unlikely to be transferred to the anode 102 through the concave 109. On the other hand, a region of the anode 102, which is in contact with the substrate 11, is excellent in thermal conductivity, and therefore plasma heat in the substrate 11 is likely to be drawn from the peripheral part 11y of the substrate 11 rather than the central part 11x of the substrate 11, so that temperature of the peripheral part 11y of the substrate 11 can be kept lower than that of the central part 11x of the substrate 11. Accordingly, a film having good uniformity in electrical characteristics within a surface of the substrate 11 can be formed.

Figure 16:
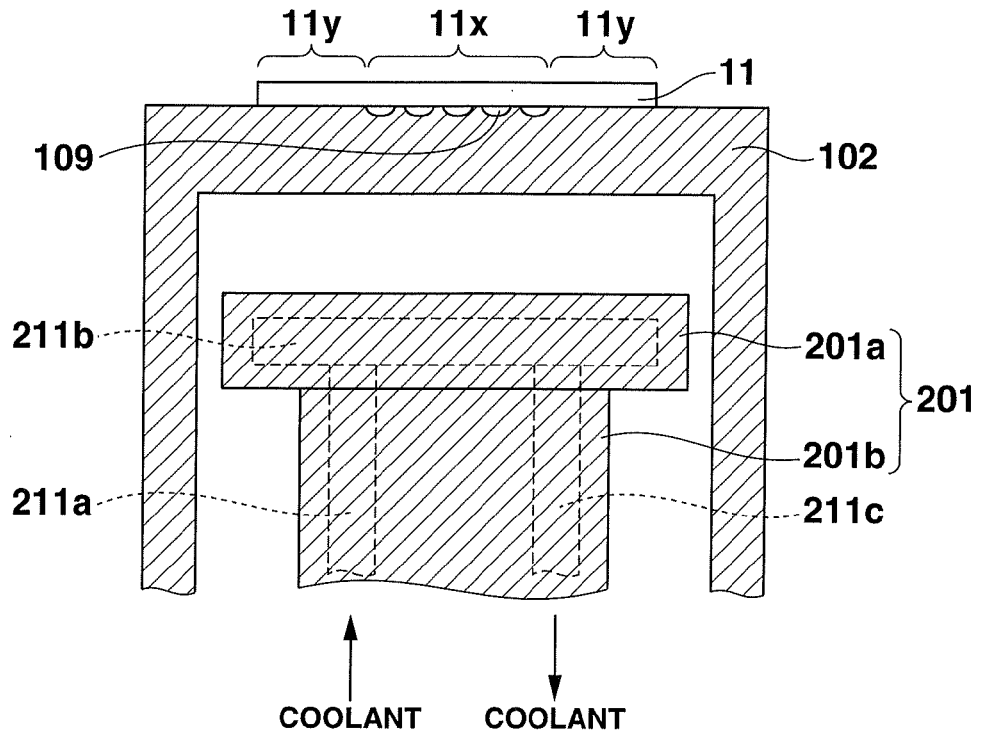
FIG. 16 is a diagram illustrating another embodiment of the present invention.

As another embodiment of the present invention, a part of deposition apparatus in which a substrate 11 is placed on an anode 102 combined with a stage is illustrated in FIG. 16. The anode 102 has a plurality of concaves 109 not in contact with the substrate 11 on a surface thereof brought into contact with the substrate 11. Each of the concaves 109 may be of a semispherical, conical, or polypyramidal shape, or of any other geometrical shape, and the respective concaves 109 may be similar in shape to one another or different in shape from one another. Also, the plurality of concaves 109 are formed only in a region corresponding to a central part 11x of the substrate 11, and therefore a contact area per unit area between the substrate 11 and the anode 102 in a region corresponding to a peripheral part 11y of the substrate 11 is larger than that between the substrate 11 and the anode 102 depending on the concaves 109 in a region corresponding to the central part 11x of the substrate 11. Also, in a space arising between the concave 109 and the substrate 11, gas that is poorer in thermal conductivity than solid intervenes, and therefore heat from the substrate 11 is unlikely to be transferred to the anode 102 through the concave 109. On the other hand, the region of the anode 102, which is in contact with the substrate 11, is excellent in thermal conductivity, and therefore plasma heat in the substrate 11 is likely to be drawn from the peripheral part 11y of the substrate 11 rather than the central part 11x of the substrate 11, so that temperature of the peripheral part 11y of the substrate 11 can be kept lower than that of the central part 11x of the substrate 11. Accordingly, a film having good uniformity in electrical characteristics within a surface of the substrate 11 can be formed.

Figure 17:
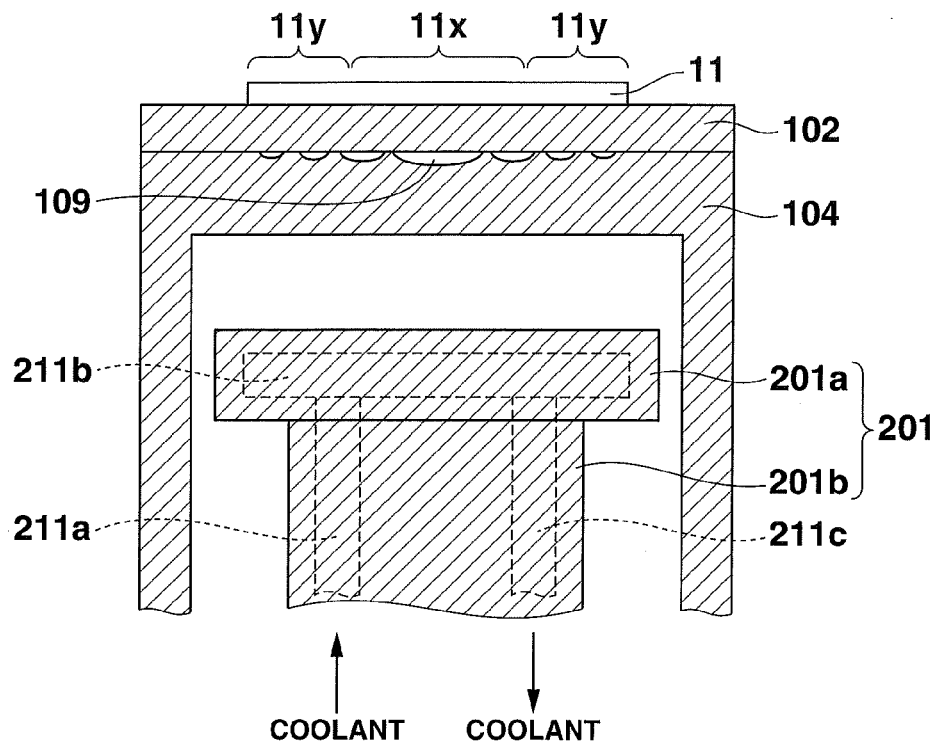
FIG. 17 is a diagram illustrating another embodiment of the present invention.

As another embodiment of the present invention, a part of deposition apparatus in which a stage 104 and an anode 102 are separate is illustrated in FIG. 17. The stage 104 has a plurality of concaves 109 not in contact with the anode 102 on a surface thereof brought into contact with the anode 102. Each of the concaves 109 may be of a semispherical, conical, or polypyramidal shape, or of any other geometrical shape, and the respective concaves 109 may be similar in shape to one another or different in shape from one another. Also, the plurality of concaves 109 are gradually decreased in size from a region corresponding to a central part 11x of a substrate 11 to that corresponding to a peripheral part 11y of the substrate 11, and therefore a contact area per unit area between the anode 102 and the stage 104 depending on the concaves 109 in the region corresponding to the peripheral part 11y of the substrate 11 is larger than that between the anode 102 and the stage 104 depending on the concaves 109 in the region corresponding to the central part 11x of the substrate 11. Further, in a space arising between the concave 109 and the anode 102, gas that is poorer in thermal conductivity than solid intervenes, and therefore heat from the anode 102 is unlikely to be transferred to the stage 104 through the concave 109. On the other hand, the region of the stage 104, which is in contact with the anode 102, is excellent in thermal conductivity, and therefore plasma heat in the substrate 11 is likely to be drawn from the peripheral part 11y of the substrate 11 rather than the central part 11x of the substrate 11, so that temperature of the peripheral part 11y of the substrate 11 can be kept lower than that of the central part 11x of the substrate 11. Accordingly, a film having good uniformity in electrical characteristics within a surface of the substrate 11 can be formed.

Figure 18:
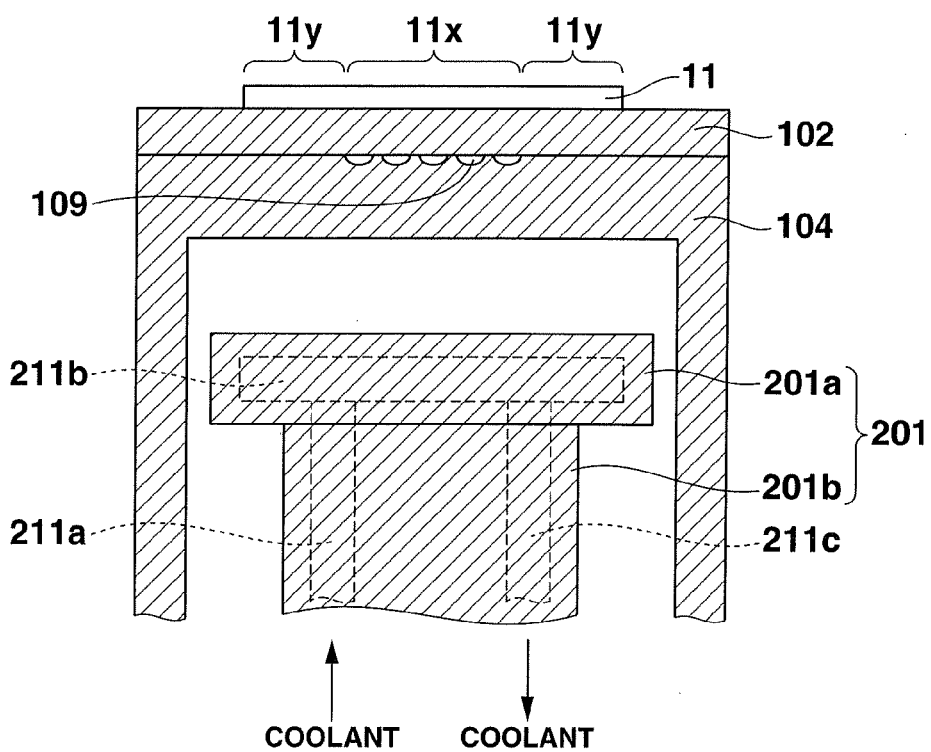
FIG. 18 is a diagram illustrating another embodiment of the present invention.

As another embodiment of the present invention, a part of deposition apparatus in which a stage 104 and an anode 102 are separate is illustrated in FIG. 18. The stage 104 has a plurality of concaves 109 not in contact with the anode 102 on a surface thereof brought into contact with the anode 102. Each of the concaves 109 may be of a semispherical, conical, or polypyramidal shape, or of any other geometrical shape, and the respective concaves 109 may be similar in shape to one another or different in shape from one another. Also, the plurality of concaves 109 are formed only in a region corresponding to a central part 11x of the substrate 11, and therefore a contact area per unit area between the anode 102 and the stage 104 in a region corresponding to a peripheral part 11y of the substrate 11 is larger than that between the anode 102 and the stage 104 depending on the concaves 109 in the region corresponding to the central part 11x of the substrate 11. Further, in a space arising between the concave 109 and the anode 102, gas that is poorer in thermal conductivity than solid intervenes, and therefore heat from the anode 102 is unlikely to be transferred to the stage 104 through the concave 109. On the other hand, the region of the stage 104, which is in contact with the anode 102, is excellent in thermal conductivity, and therefore plasma heat in the substrate 11 is likely to be drawn from the peripheral part 11y of the substrate 11 rather than the central part 11x of the substrate 11, so that temperature of the peripheral part 11y of the substrate 11 can be kept lower than that of the central part 11x of the substrate 11. Accordingly, a film having good uniformity in electrical characteristics within a surface of the substrate 11 can be formed.

Figure 19:
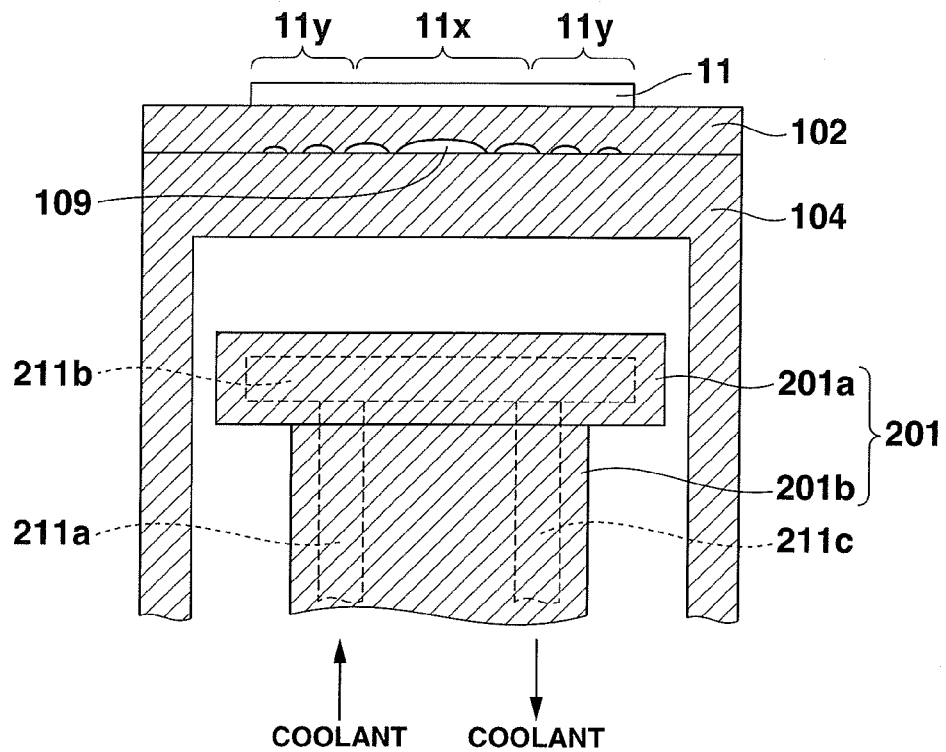
FIG. 19 is a diagram illustrating another embodiment of the present invention.

As another embodiment of the present invention, a part of deposition apparatus in which a stage 104 and an anode 102 are separate is illustrated in FIG. 19. The anode 102 has a plurality of concaves 109 not in contact with the stage 104 on a surface thereof brought into contact with the stage 104. Each of the concaves 109 may be of a semispherical, conical, or polypyramidal shape, or of any other geometrical shape, and the respective concaves 109 may be similar in shape to one another or different in shape from one another. Also, the plurality of concaves 109 are gradually decreased in size from a region corresponding to a central part 11x of a substrate 11 to that corresponding to a peripheral part 11y of the substrate 11, and therefore a contact area per unit area between the anode 102 and the stage 104 depending on the concaves 109 in the region corresponding to the peripheral part 11y of the substrate 11 is larger than that between the anode 102 and the stage 104 depending on the concaves 109 in the region corresponding to the central part 11x of the substrate 11. Further, in a space arising between the concave 109 and the stage 104, gas that is poorer in thermal conductivity than solid intervenes, and therefore heat from the anode 102 is unlikely to be transferred to the stage 104 through the concave 109. On the other hand, the region of the stage 104, which is in contact with the anode 102, is excellent in thermal conductivity, and therefore plasma heat in the substrate 11 is likely to be drawn from the peripheral part 11y of the substrate 11 rather than the central part 11x of the substrate 11, so that temperature of the peripheral part 11y of the substrate 11 can be kept lower than that of the central part 11x of the substrate 11. Accordingly, a film having good uniformity in electrical characteristics within a surface of the substrate 11 can be formed.

Figure 20:
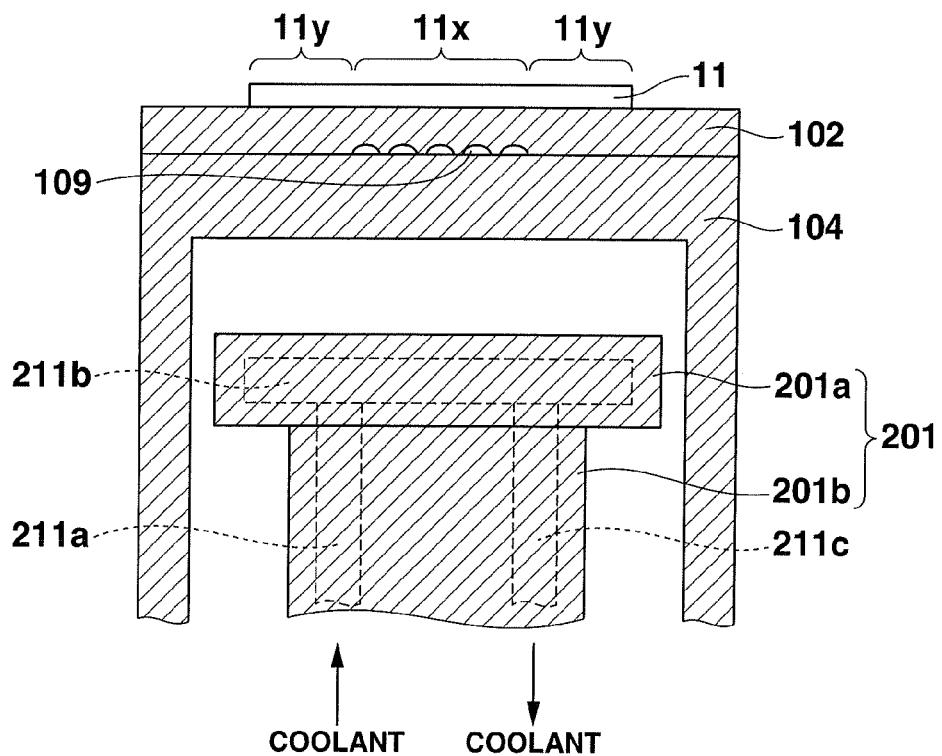
FIG. 20 is a diagram illustrating another embodiment of the present invention.

As another embodiment of the present invention, a part of deposition apparatus in which a stage 104 and an anode 102 are separate is illustrated in FIG. 20. The anode 102 has a plurality of concaves 109 not in contact with the stage 104 on a surface thereof brought into contact with the stage 104. Each of the concaves 109 may be of a semispherical, conical, or polypyramidal shape, or of any other geometrical shape, and the respective concaves 109 may be similar in shape to one another or different in shape from one another. Also, the plurality of concaves 109 are formed only in a region corresponding to a central part 11x of the substrate 11, and therefore a contact area per unit area between the anode 102 and the stage 104 in a region corresponding to a peripheral part 11y of a substrate 11 is larger than that between the anode 102 and the stage 104 depending on the concaves 109 in the region corresponding to the central part 11x of the substrate 11. Further, in a space arising between the concave 109 and the stage 104, gas that is poorer in thermal conductivity than solid intervenes, and therefore heat from the anode 102 is unlikely to be transferred to the stage 104 through the concave 109. On the other hand, the region of the stage 104, which is in contact with the anode 102, is excellent in thermal conductivity, and therefore plasma heat in the substrate 11 is likely to be drawn from the peripheral part 11y of the substrate 11 rather than the central part 11x of the substrate 11, so that temperature of the peripheral part 11y of the substrate 11 can be kept lower than that of the central part 11x of the substrate 11. Accordingly, a film having good uniformity in electrical characteristics within a surface of the substrate 11 can be formed.

Figure 21A:
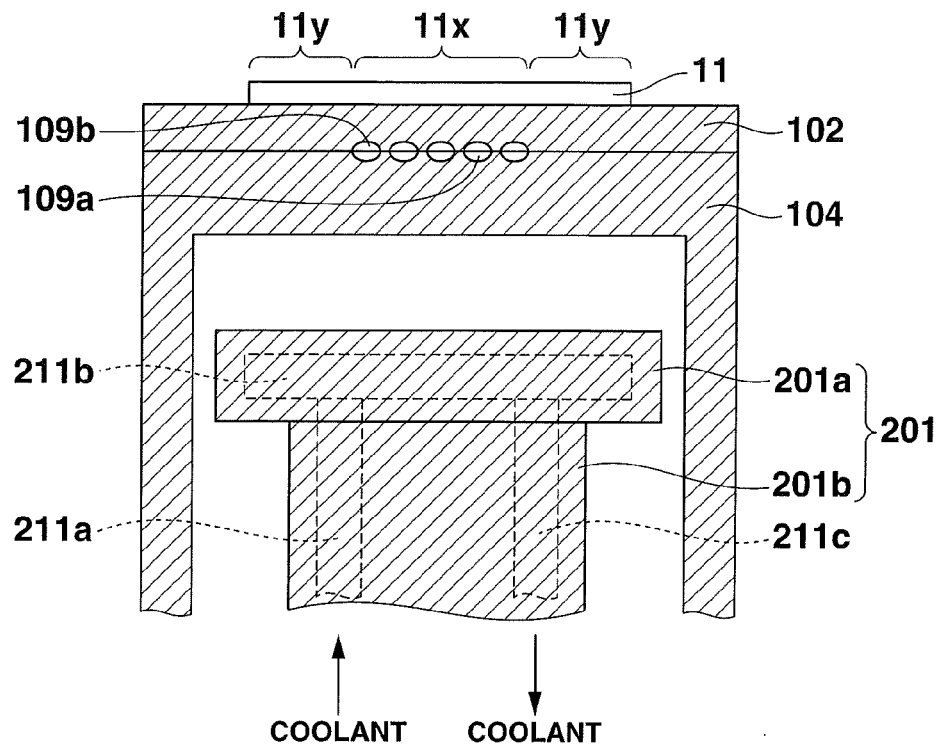
FIGS. 21A and 21B are diagrams illustrating other embodiments of the present invention.
Figure 21B:
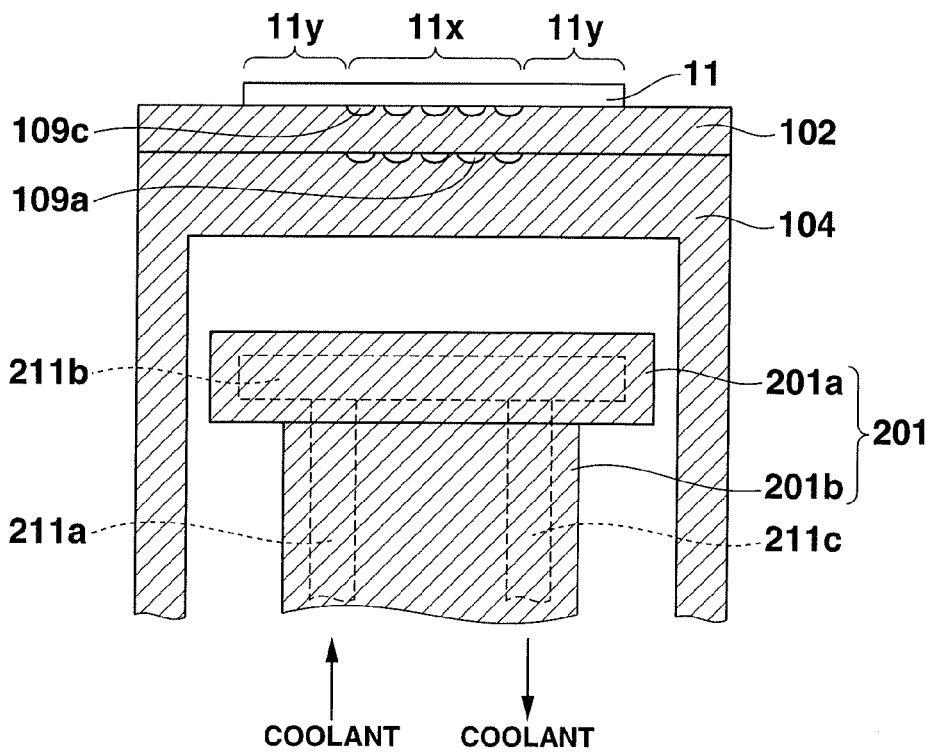
Figure 22A:
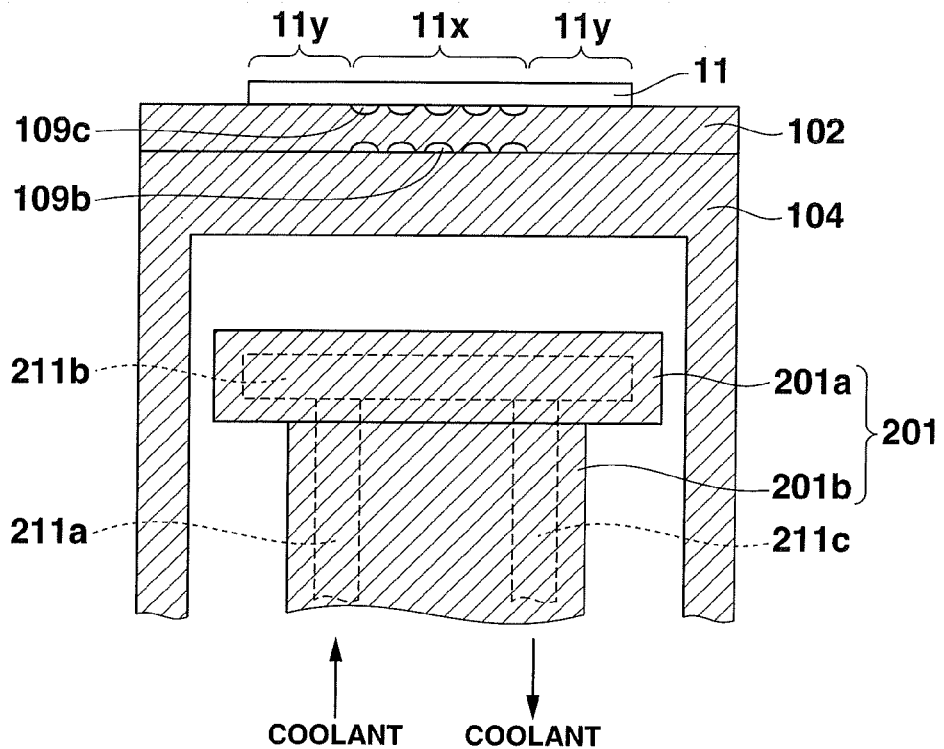
FIGS. 22A and 22B are diagrams illustrating other embodiments of the present invention.
Figure 22B:
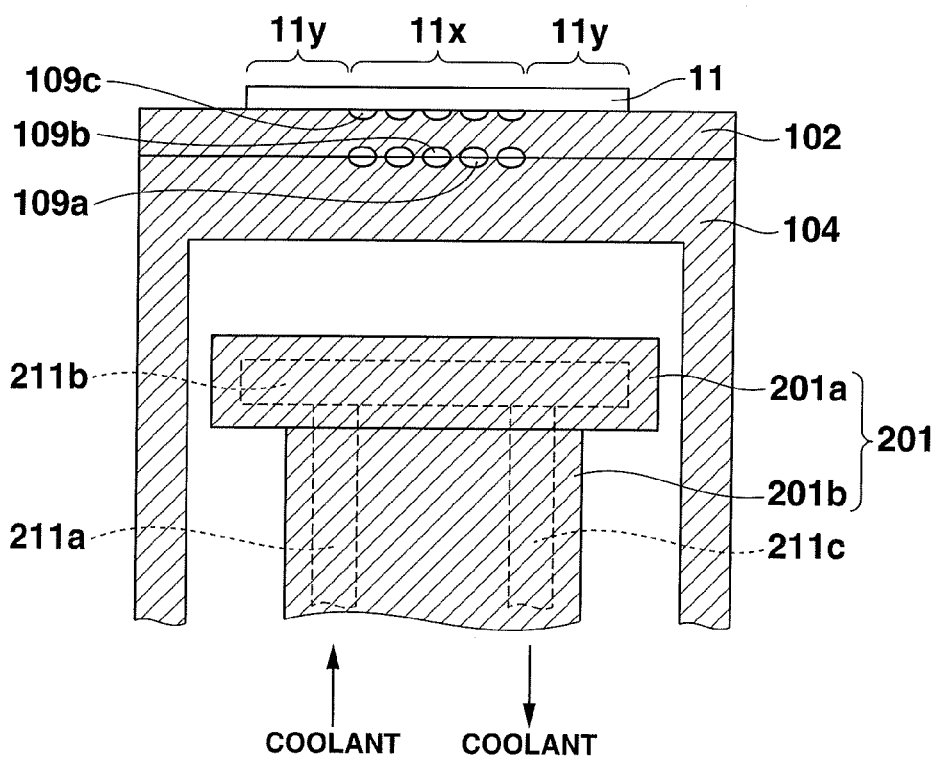

Also, in each of the above-described embodiments, the concaves or concave part are provided in one member; however, if the effect of the invention can be expected, the members having the concaves or concave part in the above-described plurality of embodiments may be appropriately combined to provide the concaves or concave part in a plurality of members, or the concaves or concave parts may be provided on the both surface of the anode 102. For example, as illustrated in FIG. 21A, on a surface of the placing stage 104 on which the anode 102 is placed, concaves 109a may be formed, and further on a surface of the anode 102, which is opposed to the placing stage 104, concaves 109b may be formed. Also, as illustrated in FIG. 21B, on a surface of the placing stage 104, which is opposed to the anode 102, the concaves 109a may be formed, and further on a surface of the anode 102, which is opposed to the substrate 11, concaves 109c may be formed. Further, as illustrated in FIG. 22A, on the surface of the anode, which is opposed to the placing stage 104, the concaves 109b may be provided, whereas on the surface of the anode 102, which is opposed to the substrate 11, the concaves 109c may be formed, and as illustrated in FIG. 22B, the concaves 109a, 109b, and 109c may be formed on the surface of the placing stage 104 opposed to the anode 102, on the surface of the anode 102 opposed to the placing stage 104, and on the surface of the anode 102 opposed to the substrate 11, respectively.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2007-335048 filed on 26 Dec. 2007 and including specification, claims, drawings and summary. The disclosure of the above Japanese Patent Application is incorporated herein by reference in its entirety.

What is claimed is:

1. A deposition apparatus comprising:
a first electrode on which a processing object is placable;
a placing stage having a first surface on which the first electrode is mounted and a second surface opposite to the first surface;
a second electrode for generating plasma with the first electrode, the second electrode being opposed to the first electrode; and
a cooling part for cooling the processing object;
wherein the first surface of the placing stage includes at least one concave at which the placing stage separates from the first electrode such that a contact area per unit area between a peripheral part of the processing object and the placing stage is larger than a contact area per unit area between a central part of the processing object and the placing stage, thereby causing a thermal resistance between the central part of the processing object and the cooling part to be larger than a thermal resistance between the peripheral part of the processing object and the cooling part.

2. The deposition apparatus according to claim 1, wherein: the first electrode has a concave on a surface thereof coming into contact with the processing object; and a contact area in a region corresponding to the peripheral part of the processing object is larger than a contact area in a region corresponding to the central part of the processing object, depending on the concave of the first electrode.

3. The deposition apparatus according to claim 1, wherein the first electrode has a concave in a region corresponding to the central part of the processing object, and does not have a concave in a region corresponding to the peripheral part of the processing object, on a surface of the first electrode which comes into contact with the processing object.

4. The deposition apparatus according to claim 1, wherein the concave of the placing stage is provided in a region corresponding to the central part of the processing object, and the placing stage does not have a concave in a region corresponding to the peripheral part of the processing object, on the first surface.

5. The deposition apparatus according to claim 1, wherein:
the first electrode has a concave on a surface thereof coming into contact with the placing stage; and
a contact area in a region corresponding to the peripheral part of the processing object is larger than a contact area in a region corresponding to the central part of the processing object, depending on the concave of the first electrode.

6. The deposition apparatus according to claim 1, wherein the first electrode has a concave in a region corresponding to the central part of the processing object, and does not have a concave in a region corresponding to the peripheral part of the processing object, on a surface of the first electrode which comes into contact with the placing stage.

7. A deposition apparatus comprising:
a first electrode on which a processing object is placable;
a placing stage having a first surface on which the first electrode is mounted and a second surface opposite to the first surface;
a second electrode for generating plasma with the first electrode, the second electrode being opposed to the first electrode; and
a cooling part for drawing heat from the processing object to generate a heat flow from a central area to a peripheral area of the processing object;
wherein:
the first surface of the placing stage includes at least one concave at which the placing stage separates from the first electrode such that a contact area per unit area between a peripheral part of the processing object and the placing stage is larger than a contact area per unit area between a central part of the processing object and the placing stage, thereby causing a thermal resistance between the peripheral part of the processing object and the placing stage to be smaller than a thermal resistance between the central part of the processing object and the placing stage; and
the cooling part has a third surface facing to the second surface of the placing stage, the third face of the cooling part including a concave such that a thermal resistance between the central part of the processing object and the cooling part is larger than a thermal resistance between the peripheral part of the processing object and the cooling part.

8. The deposition apparatus according to claim 7, wherein the cooling part comprises a cooling head part.

9. The deposition apparatus according to claim 7, wherein: the cooling part comprises a cooling head part;

the third surface of the cooling head part is formed with a plurality of concaves, a number of the concaves being more in a central area of the cooling head part than in a peripheral area; and a contact area at which the cooling head part comes into contact with the placing stage in the peripheral area is larger than a contact area at which the cooling head part comes into contact with the placing stage in the central area.

10. The deposition apparatus according to claim 7, wherein:

the cooling part comprises a cooling head part;

the third surface of the cooling head part is more roughed in a central area as compared with a peripheral area; and a contact area at which the cooling head part comes into contact with the placing stage in the peripheral area is larger than a contact area at which the cooling head part comes into contact with the placing stage in the central area.

11. The deposition apparatus according to claim 7, wherein:

the cooling part comprises a cooling head part;

the third surface of the cooling head part is formed of a first material and a second material in a central area and a peripheral area, respectively; and a thermal conductivity of the second material is larger than a thermal conductivity of the first material.

12. The deposition apparatus according to claim 7, wherein the cooling part includes a pipeline through which a cooling medium passes.

* * * * *